(12) United States Patent
Tanaka

(10) Patent No.: US 9,859,391 B2
(45) Date of Patent: Jan. 2, 2018

(54) THIN FILM TRANSISTOR, DISPLAY DEVICE, AND METHOD FOR MANUFACTURING THIN FILM TRANSISTOR

(71) Applicant: NLT TECHNOLOGIES, LTD., Kawasaki, Kanagawa (JP)

(72) Inventor: Jun Tanaka, Kawasaki (JP)

(73) Assignee: NLT Technologies, Ltd., Kawasaki, Kanagawa (JP)

( * ) Notice: Subject to any disclaimer, the term of this patent is extended or adjusted under 35 U.S.C. 154(b) by 0 days.

(21) Appl. No.: 15/334,930

(22) Filed: Oct. 26, 2016

(65) Prior Publication Data

US 2017/0117374 A1    Apr. 27, 2017

(30) Foreign Application Priority Data

Oct. 27, 2015  (JP) .................................. 2015-211152
Jul. 13, 2016  (JP) .................................. 2016-138874

(51) Int. Cl.
*H01L 29/78*    (2006.01)
*H01L 29/423*   (2006.01)
(Continued)

(52) U.S. Cl.
CPC ...... *H01L 29/42384* (2013.01); *H01L 21/385* (2013.01); *H01L 29/0847* (2013.01);
(Continued)

(58) Field of Classification Search
CPC .......... H01L 29/7869; H01L 29/66969; H01L 27/1225; H01L 29/78606; H01L 21/02565;
(Continued)

(56) References Cited

U.S. PATENT DOCUMENTS 9,324,743 B2 *  4/2016  Jung ................... H01L 27/1288
2012/0032173 A1 *  2/2012  Sato .................. H01L 29/78618
257/59

(Continued)

FOREIGN PATENT DOCUMENTS

JP    2007-220817 A    8/2007
JP    2012-33836 A     2/2012

OTHER PUBLICATIONS

Hidehito Kitakado, et al., "Channel shortening phenomenon due to redox reaction in a lateral direction on In—Ga—Zn—O Thin film transistors" (Proceedings of the eighteenth international workshop on Active-Matrix flat panel displays and devices—TFT technologies and FPD materials), 2011, pp. 29-34.

*Primary Examiner* — Roy Potter
*Assistant Examiner* — Paul Patton
(74) *Attorney, Agent, or Firm* — Sughrue Mion, PLLC

(57) ABSTRACT

Provided is an oxide semiconductor thin film transistor with low parasitic capacitance and high reliability.
A thin film transistor includes a substrate, an oxide semiconductor layer including a channel region, a source region, and a drain region, a gate insulating film, and a gate electrode. The gate insulating film includes one layer or two layers, at least one of the layers of the gate insulating film is a patterned gate insulating film located at a position separated from the source electrode and the drain electrode. A length of a lower surface of the patterned gate insulating film in a channel length direction is greater than a length of a lower surface of the gate electrode in the channel length direction. The length of the lower surface of the patterned gate insulating film in the channel length direction is greater than a length of the channel region in the channel length direction. The source region and the drain region have a higher hydrogen concentration than the channel region.

12 Claims, 39 Drawing Sheets

(51) Int. Cl.
*H01L 29/786* (2006.01)
*H01L 29/66* (2006.01)
*H01L 29/08* (2006.01)
*H01L 21/385* (2006.01)

(52) U.S. Cl.
CPC .... *H01L 29/66969* (2013.01); *H01L 29/7869* (2013.01); *H01L 2029/42388* (2013.01)

(58) Field of Classification Search
CPC ........... H01L 29/42384; H01L 29/4908; H01L 29/78603; H01L 29/66742; H01L 29/78696; H01L 29/78693
See application file for complete search history.

(56) References Cited

U.S. PATENT DOCUMENTS

2013/0037793 A1* 2/2013 Pan .................. H01L 29/78618
257/43
2013/0320339 A1* 12/2013 Kawashima ...... H01L 29/66765
257/43

* cited by examiner

CHANNEL LENGTH DIRECTION

THIN FILM TRANSISTOR, DISPLAY DEVICE, AND METHOD FOR MANUFACTURING THIN FILM TRANSISTOR

This non-provisional application claims priorities under 35 U.S.C. §119(a) on Patent Application No. 2015-211152 filed in Japan on Oct. 27, 2015 and Patent Application No. 2016-138874 filed in Japan on Jul. 13, 2016, the entire contents of which are hereby incorporated by reference.

FIELD

The present invention relates to a thin film transistor, a display device, and a method for manufacturing a thin film transistor.

BACKGROUND

An oxide semiconductor thin film transistor using an oxide semiconductor which is typified by an indium-gallium-zinc oxide (hereinafter, referred to as InGaZnO) can achieve good electrical characteristics in a large area, as compared to a silicon-based semiconductor thin film transistor. In the following description, in some cases, a thin film transistor is abbreviated to TFT.

An oxide semiconductor TFT has started to be applied to a liquid crystal display and an organic electro-luminescence (EL) display. In the following description, the liquid crystal display is abbreviated to LCD. In addition, the organic EL display is abbreviated to OLED.

In recent years, a bottom-gate TFT has been mainly used as the oxide semiconductor TFT. A self-aligned top-gate TFT is advantageous when a large LCD or OLED is driven at a high speed. In the self-aligned top-gate TFT, low parasitic capacitance is generated in a region in which a gate electrode and a source electrode or a drain electrode overlap each other and a region in which the gate electrode and a source region or a drain region overlap each other.

FIG. 27 is a cross-sectional view schematically illustrating a self-aligned top-gate TFT disclosed in Japanese Patent Application Laid-Open No. 2007-220817. The self-aligned top-gate TFT includes a substrate 1, an oxide semiconductor layer 2, a gate insulating film 3, a gate electrode 4, a source-side contact hole 62, a drain-side contact hole 63, a source electrode 72, a drain electrode 73, and an interlayer insulating film 5. The oxide semiconductor layer 2 includes a channel region 21, a source region 22, and a drain region 23.

Japanese Patent Application Laid-Open No. 2007-220817 uses the properties of the oxide semiconductor in which hydrogen functions as a donor and resistance is variable. That is, a silicon nitride film containing a small amount of hydrogen is used as the gate insulating film 3 to reduce the amount of hydrogen in the channel region 21. Therefore, the high resistance of the channel region 21 is maintained. A silicon nitride film containing a large amount of hydrogen is used as the interlayer insulating film 5 to diffuse a large amount of hydrogen to the source region 22 and the drain region 23. Therefore, the resistance of the source region 22 and the drain region 23 is reduced.

Japanese Patent Application Laid-Open No. 2012-033836 discloses a top-gate TFT in which a gate electrode 4 has a function of suppressing the diffusion of hydrogen and the diffusion of hydrogen to a channel region 21 is suppressed when an interlayer insulating film 5 is formed.

In Japanese Patent Application Laid-Open No. 2007-220817 and Japanese Patent Application Laid-Open No. 2012-033836, the gate electrode 4 and the gate insulating film 3 are formed in the same pattern and hydrogen is diffused from the interlayer insulating film 5, using the pattern as a mask, to form the source region 22 and the drain region 23. Therefore, when the interlayer insulating film 5 is formed, the boundary between the channel region 21 and the source region 22 or the boundary between the channel region 21 and the drain region 23 is disposed immediately below the end of the gate electrode 4.

In order to reduce parasitic capacitance, it is necessary to suppress the diffusion of hydrogen from the source region 22 and the drain region 23 to the channel region 21 as much as possible.

H. Kitakado et al., "Channel Shortening Phenomenon Due to Redox Reaction in a Lateral Direction on In—Ga—Zn—O Thin-Film Transistors" (Proceedings of the eighteenth international workshop on Active-Matrix flat panel displays and devices—TFT technologies and FPD materials), 2011, p. 29 discloses a method for calculating a diffusion coefficient of hydrogen and the activation energy of hydrogen.

The diffusion coefficient of hydrogen and the activation energy can be calculated by Expressions (1) and Expression (2), respectively, on the basis of a model in which hydrogen is diffused from the source electrode 72 and the drain electrode 73 to an InGaZnO layer, which is an oxide semiconductor, to extend the source region 22 and the drain region 23.

[Math. 1]

$$\text{Diffusion coefficient } D(@350°\text{ C.}) = 1.2 \times 10^{-12} \text{ cm}^{-2}\text{s}^{-1} \quad (1)$$

$$\text{Activation energy } Ea = 0.66 \text{ eV} \quad (2)$$

As described above, it is preferable to suppress the diffusion of hydrogen in the horizontal direction as much as possible in order to reduce parasitic capacitance. Therefore, the formation of the interlayer insulating film 5 and the subsequent annealing process are performed at a low temperature. As a result, it is difficult to ensure the reliability of the TFT. The reason is that, in general, the electrical characteristics and quality of the insulating film, which has been formed at a low temperature and has been subjected to annealing at a low temperature, are likely to deteriorate due to restrictions.

When the insulating film, of which the electrical characteristics have deteriorated, is used as the interlayer insulating film 5, hot carriers are likely to be injected into the drain end of the gate electrode 4. In addition, the quality of the insulating film deteriorates and the insulating film which is not dense is likely to contain water. The insulating film containing water is likely to be polarized and has low alkali metal contamination resistance. As a result, the characteristics of the TFT are likely to be shifted and an S value is likely to be reduced. Here, the S value is a gate voltage value in a sub-threshold region in which a drain current is changed by one digit when a drain voltage is constant.

When the formation of the interlayer insulating film 5 and annealing are performed at a high temperature in order to improve the reliability of the TFT, an excessive amount of hydrogen is diffused from the source region 22 and the drain region 23 to the channel region 21 in the horizontal direction. As a result, the area of the overlap between the gate electrode 4 and the source region 22, or of the overlap between the gate electrode 4 and the drain region 23 increases, which results in an increase in parasitic capacitance.

In a serious situation, hydrogen in the channel region 21 is diffused from the interlayer insulating film 5 over the gate electrode 4 and the gate insulating film 3 through the gate electrode 4 and the gate insulating film 3. Then, the number of carriers in the channel region 21 increases and a resistance value is reduced. As a result, the difference between the resistance values of the channel region 21 and the source region 22, or of the channel region 21 and the drain region 23 is reduced and the performance of the TFT is insufficient.

SUMMARY

According to an aspect of the invention, a TFT includes an insulating substrate, an oxide semiconductor layer that is provided over the substrate and includes a channel region, a source region and a drain region, the source and drain regions having a lower resistance than the channel region, a gate insulating film that is provided over the oxide semiconductor layer, a gate electrode that is provided over the gate insulating film, an interlayer insulating film that is provided over the gate electrode, the gate insulating film and the oxide semiconductor layer, and contains hydrogen, a source electrode that is electrically connected to the source region through a contact hole which is formed in the interlayer insulating film; and a drain electrode that is electrically connected to the drain region through a contact hole which is formed in the interlayer insulating film. The gate insulating film includes one layer or two layers, at least one of the layers of the gate insulating film is a patterned gate insulating film located at a position separated from the source electrode and the drain electrode. A length of a lower surface of the patterned gate insulating film in a channel length direction is greater than a length of a lower surface of the gate electrode in the channel length direction. The length of the lower surface of the patterned gate insulating film in the channel length direction is greater than a length of the channel region in the channel length direction. The source region and the drain region have a higher hydrogen concentration than the channel region.

DETAILED DESCRIPTION OF THE PREFERRED EMBODIMENTS

Embodiment 1

Figure 1:
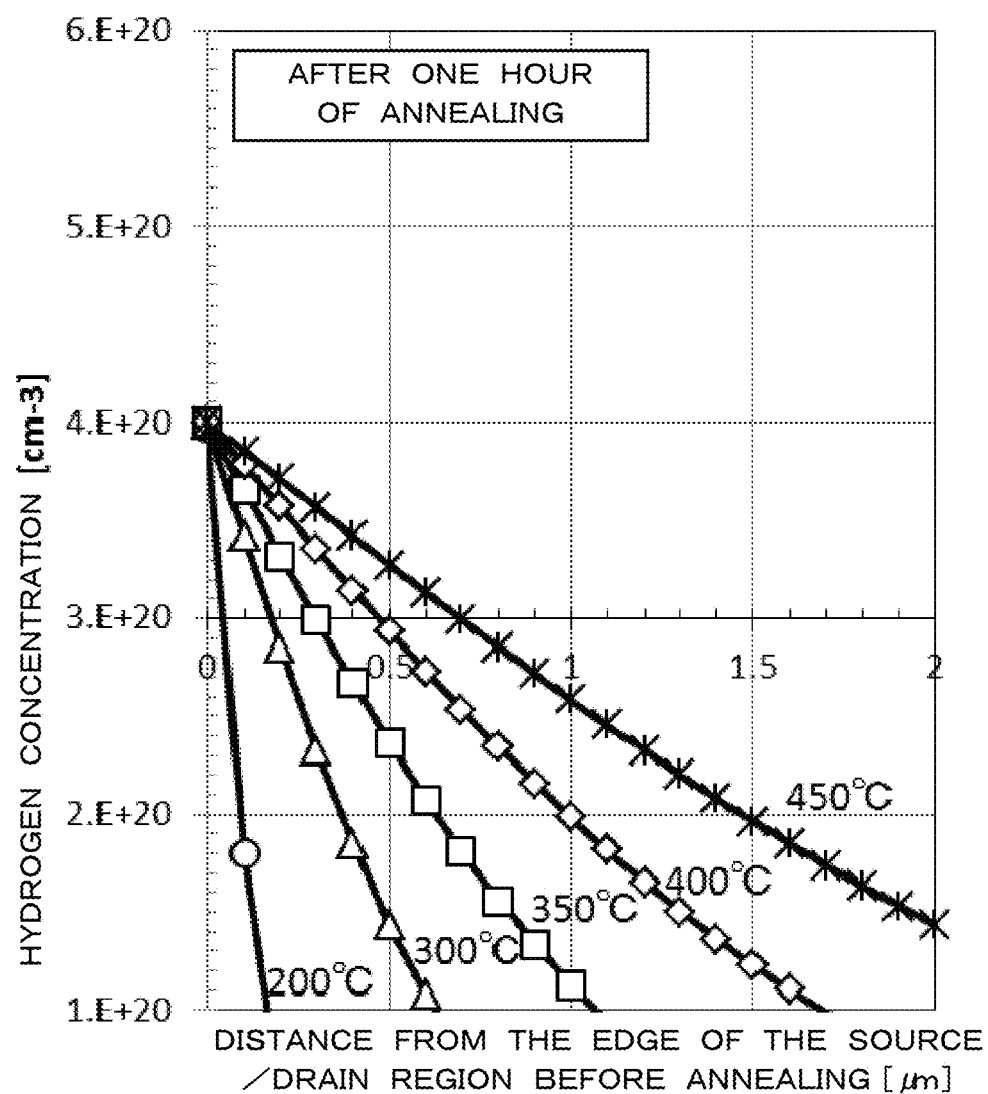
FIG. 1 is a diagram illustrating the calculation result of the relationship between a distance x from the edge of a source region or a drain region before annealing and the hydrogen concentration of a channel region after one hour of annealing.

In the specification and the claims, ordinal numbers, such as "first", "second", and "third", are given in order to clarify the relationship between elements and to prevent confusion between the elements. Therefore, the ordinal numbers do not limit the number of elements.

First, the characteristics of an oxide semiconductor will be described. Table 1 illustrates the resistance and hydrogen concentration of the oxide semiconductor.

TABLE 1

|  | Before Deposition | $SiO_2$ (100 nm) | $Al_2O_3$ (50 nm) | $SiO_2/Al_2O_3$ |
|---|---|---|---|---|
| Resistance Value of an InGaZnO Layer | $4.5 \times 10^7$ | $4.5 \times 10^{-3}$ | $4.5 \times 10^7$ | $4.5 \times 10^7$ |
| Hydrogen Concentration of an InGaZnO Layer | $2 \times 10^{20}$ | $4 \times 10^{20}$ | $2 \times 10^{20}$ | $2 \times 10^{20}$ |

A column before deposition indicates the resistance value and hydrogen concentration of an InGaZnO layer. A $SiO_2$ column indicates the resistance and hydrogen concentration of the InGaZnO layer when a silicon oxide film with a thickness of 100 nanometers is formed over the InGaZnO layer. An $Al_2O_3$ column indicates the resistance and hydrogen concentration of the InGaZnO layer when an aluminum oxide film with a thickness of 50 nanometers is formed over the InGaZnO layer. A $SiO_2/Al_2O_3$ column indicates the resistance and hydrogen concentration of the InGaZnO layer when an aluminum oxide film with a thickness of 50 nanometers is formed over the InGaZnO layer and a silicon oxide film with a thickness of 100 nanometers is formed over the aluminum oxide film.

The silicon oxide film is formed by plasma enhanced chemical vapor deposition. In the following description, the plasma enhanced chemical vapor deposition is abbreviated to PECVD. The silicon oxide film is formed by discharging tetraethylorthosilicate and oxygen gas in a chamber at 300° C. In the following description, tetraethylorthosilicate is abbreviated to TEOS.

The aluminum oxide film is formed by atomic layer deposition. In the following description, the atomic layer deposition is abbreviated to ALD. The aluminum oxide film is formed by alternately supplying trimethyl aluminum and ozone gas into the chamber at a temperature of 300° C. In the following description, trimethyl aluminum is abbreviated to TMA.

The hydrogen concentration is analyzed by secondary ion mass spectrometry. In the following description, the secondary ion mass spectrometry is abbreviated to SIMS.

As illustrated in Table 1, when the silicon oxide film is formed over the InGaZnO layer by PECVD, the resistance of the InGaZnO layer is reduced from $4.5 \times 10^7$ Ω·cm to $4.5 \times 10^{-3}$ Ω·cm and the hydrogen concentration of the InGaZnO layer increases from $2 \times 10^{20}$ cm$^{-3}$ to $4 \times 10^{20}$ cm$^{-3}$.

When the aluminum oxide film is formed over the InGaZnO layer by ALD, the resistance and hydrogen concentration of the InGaZnO layer are substantially equal to those before deposition. Even if the aluminum oxide film is formed over the InGaZnO layer by ALD and a silicon oxide film is formed over the aluminum oxide film by PECVD, the resistance and hydrogen concentration of the InGaZnO layer are substantially equal to those before deposition.

The hydrogen concentration of the silicon oxide film is $5 \times 10^{21}$ cm$^{-3}$. The hydrogen concentration of the aluminum oxide film is $2 \times 10^{21}$ cm$^{-3}$. The results indicate the followings.

When the silicon oxide film with a thickness of 100 nm is formed over the InGaZnO layer by PECVD, hydrogen is diffused and resistance is reduced. When the aluminum oxide film with a thickness of 50 nm is formed over the InGaZnO layer by ALD, the diffusion of hydrogen to the InGaZnO layer is suppressed although the aluminum oxide film contains hydrogen. Therefore, the high resistance of the InGaZnO layer can be maintained. Even if a silicon oxide film is further formed over the aluminum oxide film by PECVD, the diffusion of hydrogen to the InGaZnO layer is suppressed and the high resistance of the InGaZnO layer can be maintained.

Therefore, when the silicon oxide film formed by PECVD is used as an interlayer insulating film 5, hydrogen is diffused to a source region 22 and a drain region 23 and it is possible to reduce the resistance of the InGaZnO layer. When the aluminum oxide film formed by ALD is used as a gate insulating film 3, the diffusion of hydrogen to a channel region 21 is suppressed and it is possible to maintain the high resistance of the InGaZnO layer.

It is considered that the above-mentioned phenomenon is caused by both a difference between the materials forming the silicon oxide film and the aluminum oxide film and a difference between the deposition methods. When PECVD is used, hydrogen exists as various radicals and ions in the gas phase of a deposition chamber and ions are accelerated by the plasma sheath electric field and reach the InGaZnO layer. When ALD is used, hydrogen exists in the form of methane ($CH_4$) or water ($H_2O$) in the gas phase of the deposition chamber. Therefore, there are few ions and the sheath electric field is not generated. As a result, no ions reach the InGaZnO layer. Therefore, for example, when a silicon oxide film, a hafnium oxide film, a zirconium oxide film, an yttrium oxide film, a lanthanum oxide film, and a tantalum oxide film are formed by ALD, in addition to the aluminum oxide film, it is considered that the same characteristics as those of the aluminum oxide film formed by ALD are obtained.

Next, the diffusion of hydrogen in the horizontal direction by annealing will be described. H. Kitakado et al., "Channel Shortening Phenomenon Due to Redox Reaction in a Lateral Direction on In—Ga—Zn—O Thin-Film Transistors" (Proceedings of the eighteenth international workshop on Active-Matrix flat panel displays and devices—TFT technologies and FPD materials), 2011, p. 29 discloses a diffusion coefficient and activation energy at 350° C. The relationship between temperature and the diffusion coefficient can be calculated, using the diffusion coefficient and the Arrhenius equation, as represented by Expression (3).

[Math. 2]

$$D(T) = D0 \times \exp\left(-\frac{Ea}{kT}\right) \quad (3)$$

D(T) is a diffusion coefficient at a temperature T, D0 is a diffusion coefficient pre-factor, Ea is activation energy, and k is a Boltzmann coefficient.

The relationship between a distance x from the edge of the source region 22 or the drain region 23 and the hydrogen concentration of the channel region 21 after annealing can be calculated using the diffusion coefficient and a complementary error function, as represented by Expression (4).

[Math. 3]

$$C(x, t) = C_0 \times \mathrm{erfc}\left(\frac{x}{2 \times \sqrt{D \times t}}\right) \quad (4)$$

In Expression (4), x is a distance from the edge of the source region 22 or the drain region 23 to the channel region 21, t is the time elapsed from the start of annealing, C(x, t) is hydrogen concentration at the distance x and the time t, $C_0$ is the hydrogen concentration of an interface between the channel region 21 and the source region 22, or of an interface between the channel region 21 and the drain region 23, and erfc is a complementary error function.

FIG. 1 is a diagram illustrating the calculation result of the relationship between the distance x from the edge of the source region 22, or of the relationship between the distance x from the edge of the drain region 23 before annealing and the hydrogen concentration of the channel region 21 after one hour of annealing.

FIG. 1 is a diagram illustrating the calculation result using a complementary error function and a diffusion coefficient which is calculated at a temperature of 200° C. to 450° C. on the basis of Expression (3). In FIG. 1, the horizontal axis is the distance x from the edge of the source region 22 or the drain region 23 to the channel region 21 before annealing. In addition, x=0 indicates the boundary between the channel region 21 and the source region 22, or the boundary between the channel region 21 and the drain region 23 before annealing and x>0 indicates the channel region 21. The vertical axis is hydrogen concentration after annealing. In FIG. 1, a circle indicates a case in which annealing is performed at 200° C. A triangle indicates a case in which annealing is performed at 300° C. A rectangle indicates a case in which annealing is performed at 350° C. A rhombus indicates a case in which annealing is performed at 400° C. An asterisk indicates a case in which annealing is performed at 450° C.

As can be seen from Table 1, the hydrogen concentration of the channel region 21 before annealing is $2 \times 10^{20}$ cm$^{-3}$ and the hydrogen concentration of the source region 22 and the drain region 23 before annealing is $4 \times 10^{20}$ cm$^{-3}$. In addition, the hydrogen concentration of the boundary between the channel region 21 and the source region 22, or of the boundary between the channel region 21 and the drain region 23 is defined as $3 \times 10^{20}$ cm$^{-3}$, which is an intermediate value between the above-mentioned values. It is assumed that the hydrogen concentration of the source region 22 and the drain region 23 keeps constant during the annealing.

As can be seen from FIG. 1, hydrogen is diffused by annealing and the moving distance of the boundary between the channel region 21 and the source region 22 or of the boundary between the channel region 21 and the drain region 23 can be estimated. For example, when an annealing temperature increases from 200° C. to 400° C., the moving distance of the position of the boundary between the channel region 21 and the source region 22, or of the boundary between the channel region 21 and the drain region 23 is changed from about 0.05 micrometers to about 0.5 micrometers by the diffusion of hydrogen. When the interlayer insulating film 5 is formed, the edge of the source region 22 and the drain region 23 is separated from the end of the gate electrode 4 by the moving distance. Therefore, the diffusion of an excessively large amount of hydrogen below the gate electrode 4 is suppressed and it is possible to suppress an increase in parasitic capacitance. In addition, 400° C. is preferable annealing temperature for good electrical characteristics and the interlayer insulating film 5 having high density.

Figure 2:
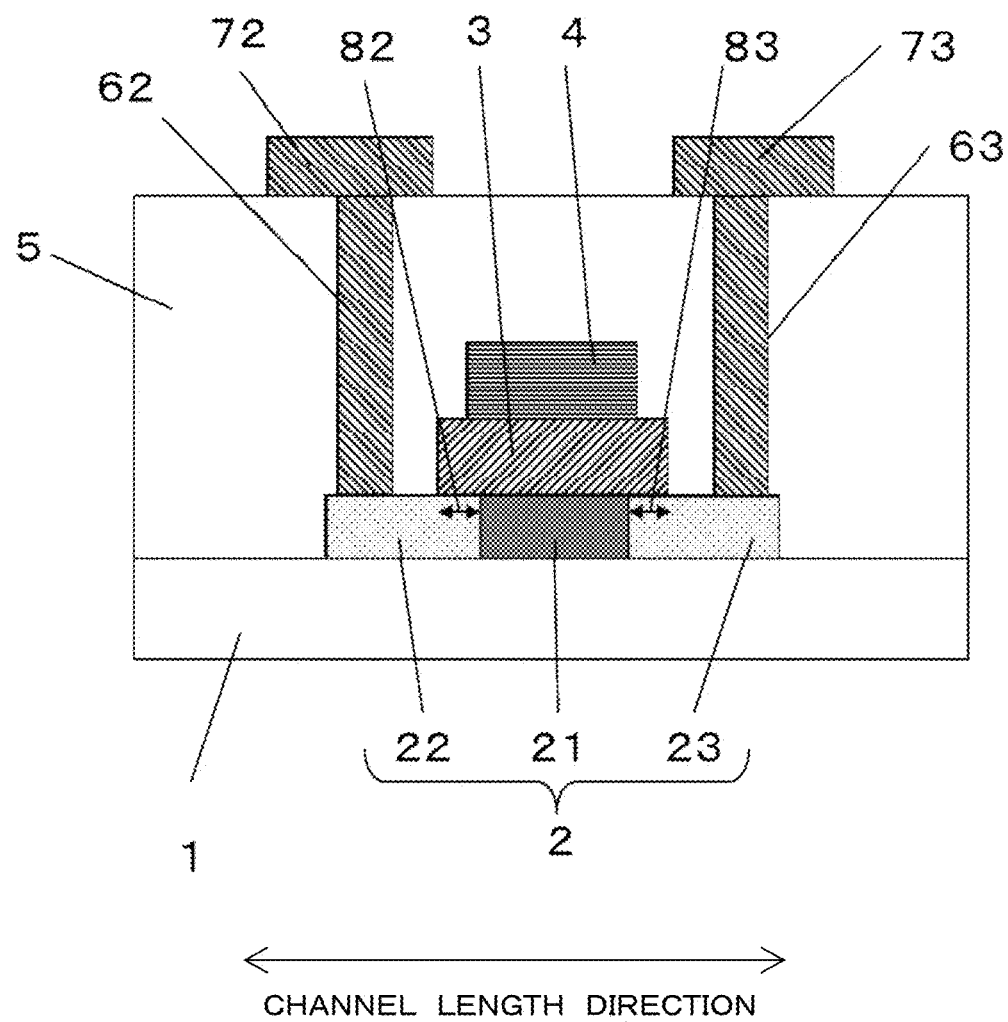
FIG. 2 is a cross-sectional view schematically illustrating a top-gate oxide semiconductor TFT according to Embodiment 1 of the invention.
Figure 3:
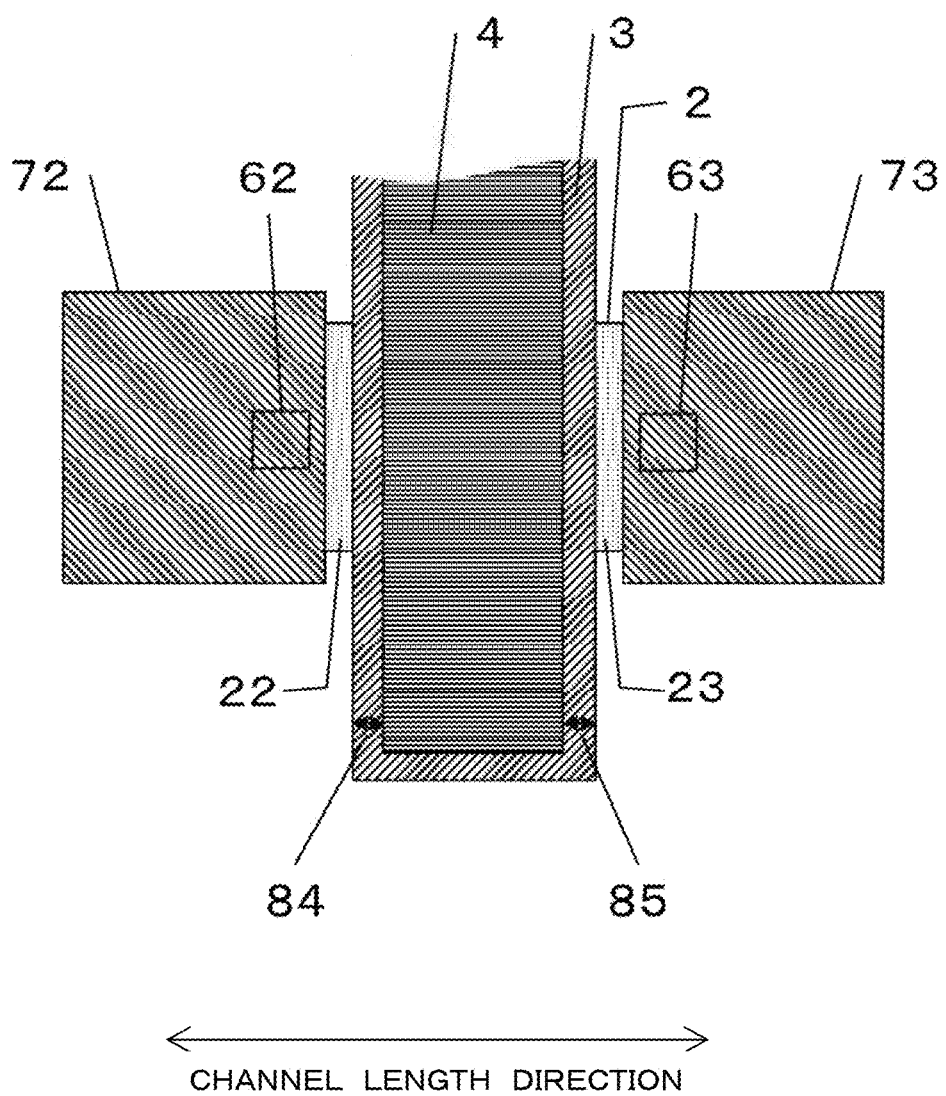
FIG. 3 is a plan view schematically illustrating the top-gate oxide semiconductor TFT according to Embodiment 1 of the invention.

Next, a top-gate oxide semiconductor TFT according to Embodiment 1 of the invention will be described. FIG. 2 is a cross-sectional view schematically illustrating the top-gate oxide semiconductor TFT according to Embodiment 1 of the invention. FIG. 3 is a plan view schematically illustrating the top-gate oxide semiconductor TFT according to Embodiment 1 of the invention. In FIGS. 2 and 3, a channel length direction is represented by a two-way arrow. In the following description, the same direction as that in FIG. 2 is the channel length direction in a cross-sectional view and the same direction as that in FIG. 3 is the channel length direction in a plan view.

In the top-gate oxide semiconductor TFT according to Embodiment 1, an oxide semiconductor layer 2 that is made of metal oxide, such as indium, gallium, zinc, tin, or aluminum oxide, is formed over an insulating substrate 1 such as a glass substrate. A source region 22 and a drain region 23 are formed in the oxide semiconductor layer 2, with a channel region 21 interposed therebetween. The source region 22 and the drain region 23 have a higher hydrogen concentration and a lower resistance than the channel region 21 due to the formation of an interlayer insulating film 5, which will be described below, and the diffusion of hydrogen by annealing.

A gate insulating film 3 which is a single-layer film, such as a silicon oxide film, an aluminum oxide film, a hafnium oxide film, a zirconium oxide film, an yttrium oxide film, a lanthanum oxide film, or a tantalum oxide film, or a stacked film thereof and has a single shape is formed in an island shape over the oxide semiconductor layer 2. The gate insulating film 3 is formed such that the length thereof in the channel length direction is greater than the width of a gate electrode 4, which will be described below, in the channel length direction and is greater than the width of the channel region 21 in the channel length direction. In other words, the gate insulating film 3 is patterned in one shape and a gate insulating film 3, which has the smallest size among the gate insulating films, that is, a minimum gate insulating film is provided such that the length thereof in the channel length direction is greater than the width of the gate electrode 4 in the channel length direction and is greater than the width of the channel region 21 in the channel length direction.

The gate electrode 4 which is a single-layer film made of molybdenum, tantalum, niobium, chromium, tungsten, aluminum, or titanium, a stacked film thereof, or a metal film made of an alloy thereof is formed over the gate insulating film 3. The gate electrode 4 is formed such that the width thereof is less than the width of the gate insulating film 3 and the length thereof in the channel length direction is less than the length of the gate insulating film 3.

The interlayer insulating film 5 which is, for example, a silicon oxide film, a silicon nitride film, or a silicon oxynitride film is formed over the oxide semiconductor layer 2, the gate insulating film 3, and the gate electrode 4. The interlayer insulating film 5 contains hydrogen since it is made of a raw material containing hydrogen. When the interlayer insulating film 5 is formed, hydrogen is diffused using the gate insulating film 3 as a mask. Therefore, the source region 22 or the drain region 23 is formed at a position where the gate insulating film 3 is removed. The channel region 21 is formed in a portion of the interlayer insulating film below the gate insulating film 3 in which the diffusion of hydrogen is suppressed. That is, the channel region 21, the source region 22, and the drain region 23 are formed with respect to the gate insulating film 3 by self-alignment.

The gate insulating film 3 is formed such that the length thereof in the channel length direction is greater than the length of the gate electrode 4. Therefore, when the interlayer insulating film 5 is formed, the boundary between the channel region 21 and the source region 22 and the boundary between the channel region 21 and the drain region 23 are formed at the positions that are separated from the gate electrode 4. Therefore, it is possible to ensure the diffusion distance of hydrogen below the gate electrode 4 and to suppress an excessively large amount of hydrogen from being diffused below the gate electrode 4. As a result, the area of the overlap between the gate electrode 4 and the source region 22, or of the overlap between the gate electrode 4 and the drain region 23 is reduced and it is possible to reduce parasitic capacitance.

Since the diffusion distance of hydrogen below the gate electrode 4 can be ensured, it is possible to perform the formation of the interlayer insulating film 5 and annealing at a high temperature. Therefore, it is possible to improve the electrical characteristics and quality of the interlayer insulating film 5 and to obtain a high-reliability TFT.

A source-side contact hole 62 that reaches the source region 22 and a drain-side contact hole 63 that reaches the drain region 23 are formed in the interlayer insulating film 5. A source electrode 72 and a drain electrode 73, each of which is a single-layer film made of molybdenum, tantalum, niobium, chromium, tungsten, aluminum, or titanium, a stacked film thereof, or a metal film made of an alloy thereof, are formed over the interlayer insulating film 5 and in the source-side contact hole 62 and the drain-side contact hole 63, respectively. The source electrode 72 and the drain electrode 73 are electrically connected to the source region 22 and the drain region 23, respectively.

In the TFT illustrated in FIGS. 2 and 3, when the interlayer insulating film 5 is formed, hydrogen is diffused, using the patterned gate insulating film 3 (patterned gate insulating film) as a mask, and the source region 22 and the drain region 23 are formed by self-alignment. Then, hydrogen is diffused from the source region 22 and the drain region 23 in the horizontal direction by annealing. Therefore, a distance 82 from an end of the gate insulating film 3 at the source region 22 side to the boundary between the source region 22 and the channel region 21 is substantially equal to a distance 83 from an end of the gate insulating film 3 at the drain region 23 side to the boundary between the drain region 23 and the channel region 21. The term "substantially equal" indicates being in a range of about 0.2 μm. The reason is as follows. When a variation in the hydrogen concentration $C_0$ of the interface between the channel region 21 and the source region 22, or of the interface between the channel region 21 and the drain region 23 is 10% as illustrated in FIG. 1, a variation in the diffusion distance of hydrogen to the channel region 21 is 0.2 μm. However, as illustrated in FIG. 1, when a temperature variation is 10° C., a variation in the diffusion distance is 0.05 μm.

When the gate insulating film 3 is removed, the boundary between the channel region 21 and the source region 22 and the boundary between the channel region 21 and the drain region 23 are exposed to dry etching or wet etching. The boundary between the channel region 21 and the source region 22 and the boundary between the channel region 21 and the drain region 23 are moved below the gate insulating film 3 by the diffusion of hydrogen by annealing. Therefore, it is possible to further improve hot carrier resistance and the reliability of the TFT.

The boundary between the channel region 21 and the source region 22 and the boundary between the channel region 21 and the drain region 23 are formed below the gate electrode 4 by the diffusion of hydrogen by annealing. Therefore, the TFT has a single drain structure and it is possible to obtain a high on-current.

The diffusion distance of hydrogen below the gate electrode 4 needs to include a positional deviation between the gate electrode 4, and the channel region 21, the source region 22, and the drain region 23. Among them, the channel region 21, the source region 22, and the drain region 23 are self-aligned with the gate insulating film 3 by the formation of the interlayer insulating film 5 and the subsequent annealing process. Therefore, as illustrated in FIGS. 2 and 3, when the gate electrode 4 is also self-aligned with the gate insulating film 3, it is possible to reduce the positional deviation between the gate electrode 4, and the channel region 21, the source region 22, and the drain region 23. As a result, it is possible to uniformly manufacture the TFT in which the area of the overlap between the gate electrode 4, and the source region 22 and the drain region 23 is small. When the gate electrode 4 is also self-aligned with the gate insulating film 3, a distance 84 from an end of the gate electrode 4 at the source region 22 side to the end of the gate insulating film 3 at the source region 22 side is substantially equal to a distance 85 from an end of the gate electrode 4 at the drain region 23 side to the end of the gate insulating film 3 at the drain region 23 side.

According to the above-mentioned structure, it is possible to obtain a top-gate oxide semiconductor TFT with low parasitic capacitance and high reliability.

Next, a method for manufacturing the TFT according to this embodiment will be described. FIGS. 4 to 10 are cross-sectional views schematically illustrating each process of manufacturing the top-gate oxide semiconductor TFT according to Embodiment 1 of the invention.

Figure 4:
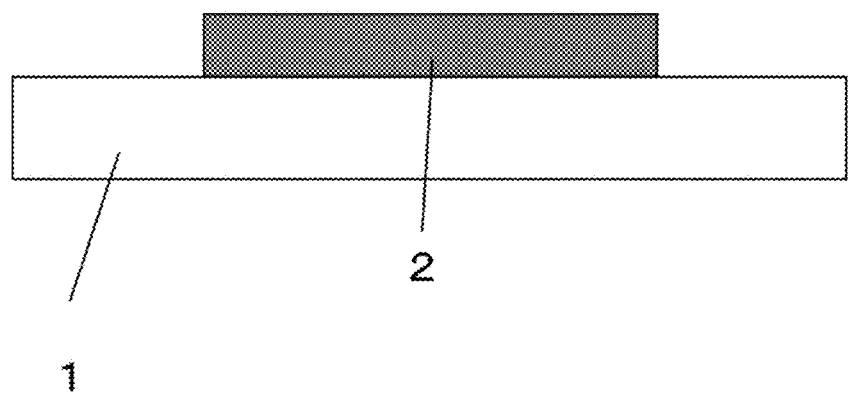
FIG. 4 is a cross-sectional view schematically illustrating each process for manufacturing the top-gate oxide semiconductor TFT according to Embodiment 1 of the invention.

FIG. 4 will be described. An amorphous InGaZnO layer with a thickness of 50 nm is formed as the oxide semiconductor layer 2 over the glass substrate 1. An island-shaped resist pattern is formed over the oxide semiconductor layer 2 by a photolithography process. Etching is performed along the resist pattern. A resist removal process is performed to form an island-shaped pattern over the oxide semiconductor layer 2.

However, in addition to the glass substrate, an insulating substrate, such as a plastic substrate, may be used as the substrate 1. In addition, the oxide semiconductor layer 2 can be made of an oxide semiconductor including an oxide of metal, such as indium, gallium, zinc, tin, or aluminum, in addition to InGaZnO. Any of an amorphous oxide semiconductor and a crystalline oxide semiconductor may be used. The thickness of the amorphous InGaZnO layer is preferably in the range of 10 nm to 200 nm.

Figure 5:
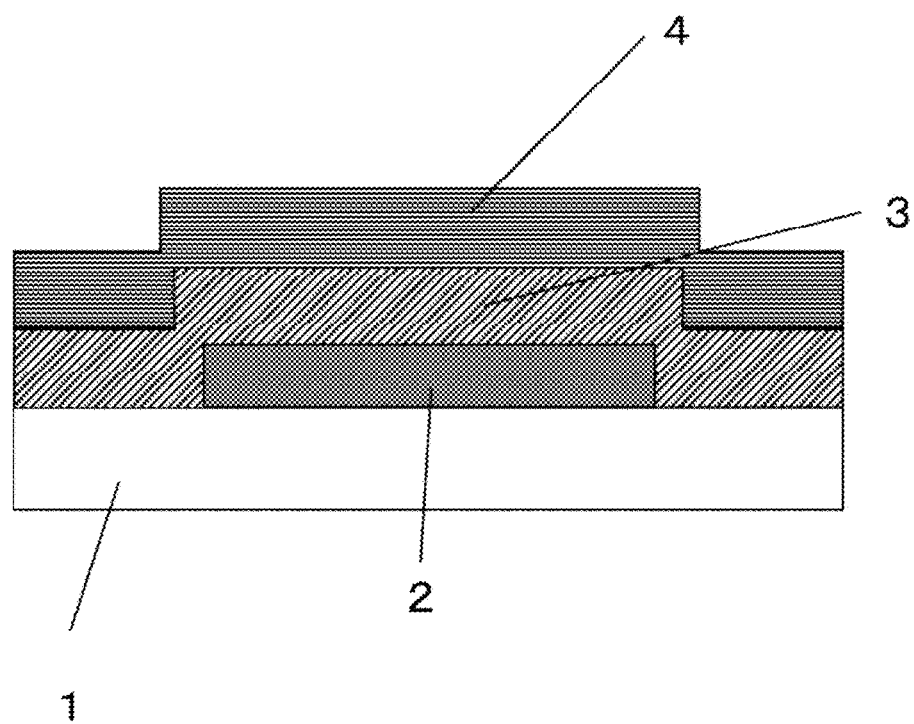
FIG. 5 is a cross-sectional view schematically illustrating each process for manufacturing the top-gate oxide semiconductor TFT according to Embodiment 1 of the invention.

FIG. 5 will be described. As illustrated in FIG. 5, an aluminum oxide film with a thickness of 50 nm is formed as the gate insulating film 3 by ALD. The gate insulating film 3 may be a single-layer film, such as a silicon oxide film, a hafnium oxide film, a zirconium oxide film, an yttrium oxide film, a lanthanum oxide film, or a tantalum oxide film, or a stacked film thereof, in addition to the aluminum oxide film. When an aluminum oxide film, a hafnium oxide film, a zirconium oxide film, an yttrium oxide film, a lanthanum oxide film, or a tantalum oxide film with a thickness of 50 nm or more is included, it is possible to particularly suppress the diffusion of hydrogen during the formation of the interlayer insulating film 5. As a method for forming the gate insulating film 3, PECVD, sputtering, or ALD can be selected. It is preferable that ALD be used to form the gate insulating film 3 in terms of the diffusion of hydrogen to the oxide semiconductor layer 2 and damage caused by ion bombardment.

As the gate electrode 4, a molybdenum film with a thickness of 100 nm is formed over the gate insulating film 3 by sputtering. As the gate electrode 4, a single-layer film made of tantalum, niobium, chromium, tungsten, aluminum, or titanium, a stacked film thereof, and a metal film made of an alloy thereof may be used, in addition to the molybdenum film. The thickness of the gate electrode 4 is preferably in the range of 50 nm to 500 nm.

Figure 6:
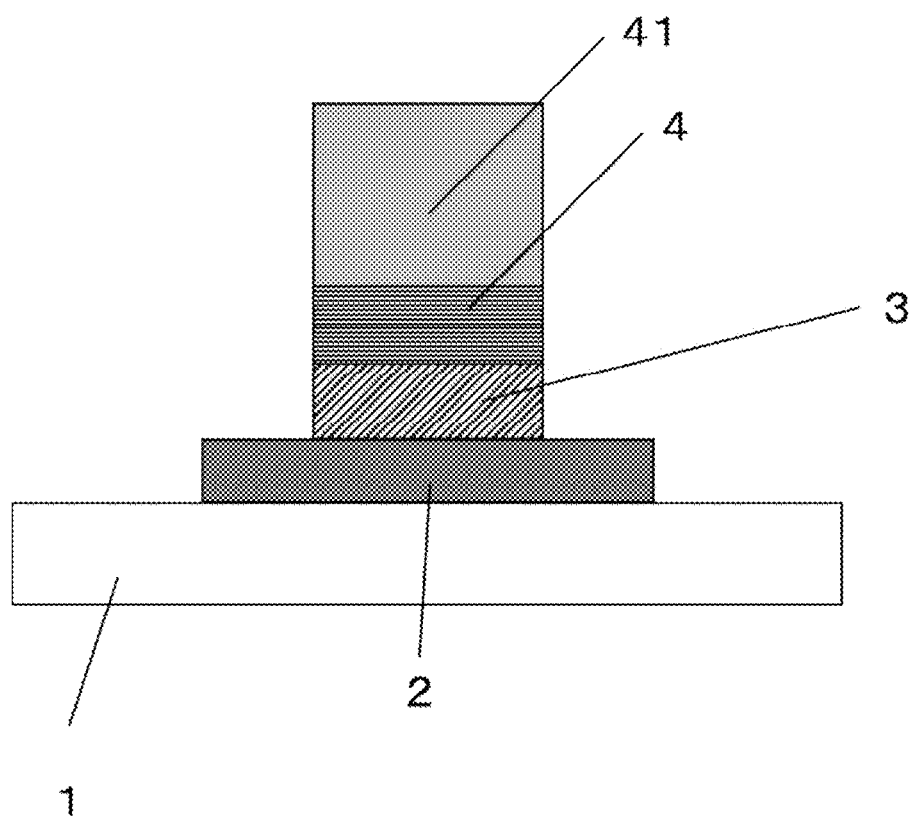
FIG. 6 is a cross-sectional view schematically illustrating each process for manufacturing the top-gate oxide semiconductor TFT according to Embodiment 1 of the invention.

As illustrated in FIG. 6, a photolithography process is performed to form an island-shaped resist pattern 41. Etching is performed along the resist pattern 41 to form the gate electrode 4 and the gate insulating film 3.

Figure 7:
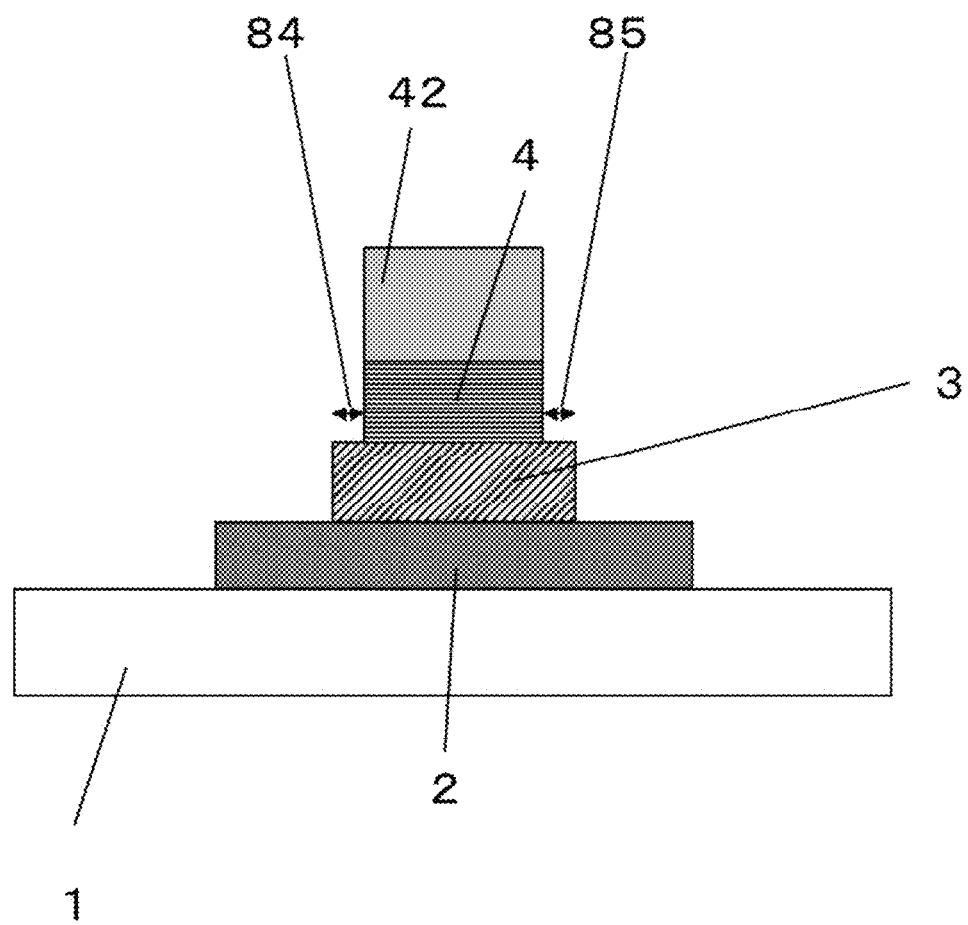
FIG. 7 is a cross-sectional view schematically illustrating each process for manufacturing the top-gate oxide semiconductor TFT according to Embodiment 1 of the invention.

As illustrated in FIG. 7, ashing is performed to reduce the width of the resist pattern 41 by 0.5 µm at one side, thereby forming a resist pattern 42. The gate electrode 4 is etched along the resist pattern 42. The resist pattern 42 may be formed by reducing the width of the resist pattern 41 by a value corresponding to the diffusion distance of hydrogen by the formation of the interlayer insulating film 5, which will be described below, and the subsequent annealing process.

Figure 8:
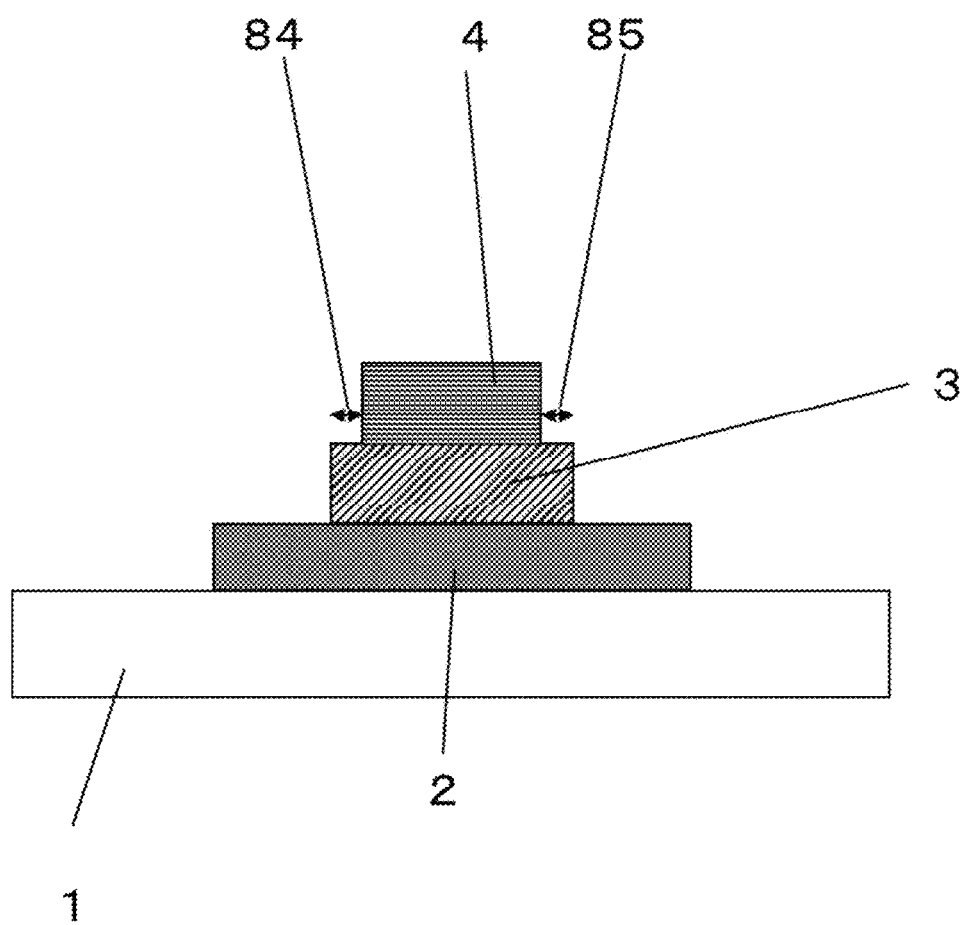
FIG. 8 is a cross-sectional view schematically illustrating each process for manufacturing the top-gate oxide semiconductor TFT according to Embodiment 1 of the invention.

As illustrated in FIG. 8, the resist pattern 42 is removed by a resist removal process. In this way, the gate insulating film 3 is formed as a patterned gate insulating film with a single shape. The length of the gate insulating film 3 in the channel length direction is greater than the width of the gate electrode 4 in the channel length direction.

In the process from FIG. 6 to FIG. 8, the gate electrode 4 and the gate insulating film 3 are formed by self-alignment. Therefore, the width of the resist pattern 41 is reduced by ashing to form the resist pattern 42. When this process is employed, the distance 84 from the end of the gate electrode 4 at the source region 22 side to the end of the gate insulating film 3 at the source region 22 side is substantially equal to the distance 85 from the end of the gate electrode 4 at the drain region 23 side to the end of the gate insulating film 3 at the drain region 23 side. The resist pattern 41 and the resist pattern 42 may be individually formed by the photolithography process.

Figure 9:
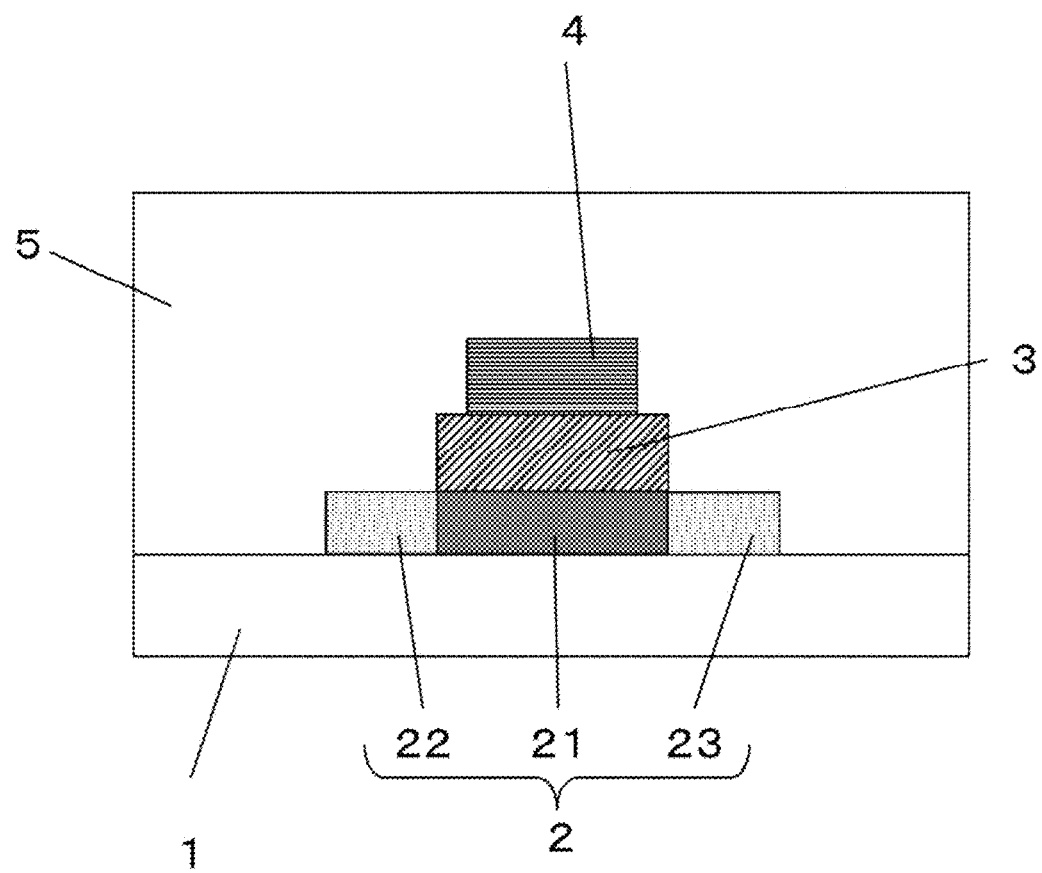
FIG. 9 is a cross-sectional view schematically illustrating each process for manufacturing the top-gate oxide semiconductor TFT according to Embodiment 1 of the invention.

As illustrated in FIG. 9, as the interlayer insulating film 5, a silicon oxide film with a thickness of 300 nm is formed by PECVD. In addition to the silicon oxide film, for example, a silicon nitride film or a silicon oxynitride film can be used as the interlayer insulating film 5. The interlayer insulating film 5 can be formed by PECVD or ALD. The interlayer insulating film 5 is made of a raw material containing hydrogen. Therefore, the interlayer insulating film 5 contains hydrogen. When the interlayer insulating film 5 is formed, hydrogen is diffused to a portion of the oxide semiconductor layer 2 which is not covered with the gate insulating film 3 to form the source region 22 and the drain region 23. Therefore, the source region 22 and the drain region 23 have a higher hydrogen concentration than the channel region 21. It is considered that the difference between the hydrogen concentrations is $2 \times 10^{20}$ cm$^{-3}$ as illustrated in Table 1. At that time, the difference in layer resistance between the channel region 21, and the source region 22 and the drain region 23 is 10 digits. Therefore, it is possible to sufficiently obtain good TFT characteristics. For this reason, it is preferable that the hydrogen concentration of the source region 22 and the drain region 23 be equal or higher than that of the channel region 21 by $2 \times 10^{20}$ cm$^{-3}$ or more.

Hydrogen is diffused to the oxide semiconductor layer 2, using the gate insulating film 3, of which the length in the channel length direction is greater than the width of the gate electrode 4 in the channel length direction, as a mask. Therefore, the boundary between the channel region 21 and the source region 22 and the boundary between the channel region 21 and the drain region 23 are formed as to be separated from the gate electrode 4. As a result, it is possible to ensure the diffusion distance of hydrogen below the gate electrode 4. It is possible to form the interlayer insulating film 5 at a high temperature of 300° C. or higher. Therefore, it is easy to obtain the interlayer insulating film 5 with good electrical characteristics and high density.

Figure 10:
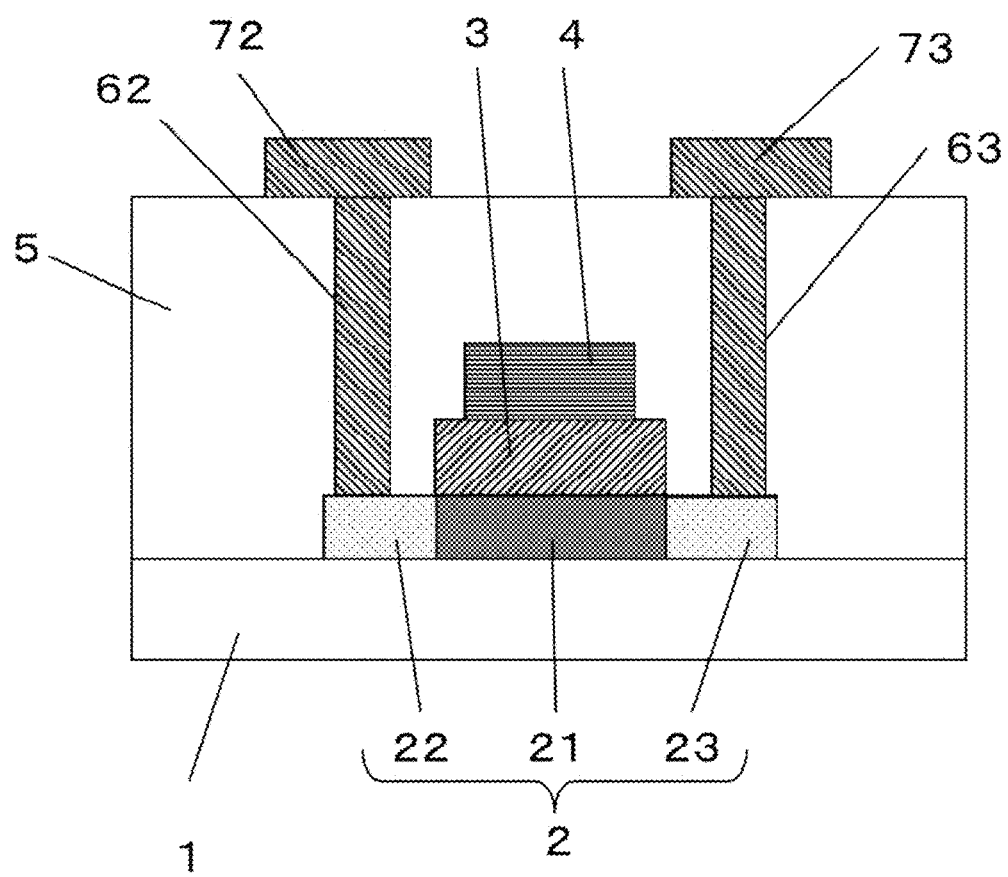
FIG. 10 is a cross-sectional view schematically illustrating each process for manufacturing the top-gate oxide semiconductor TFT according to Embodiment 1 of the invention.

FIG. 10 will be described. The source-side contact hole 62 and the drain-side contact hole 63 are formed through a contact hole photolithography process, a contact etching process, and a resist removal process. A stacked film of a molybdenum film with a thickness of 100 nm and an aluminum film with a thickness of 200 nm is formed as a metal film for the source electrode 72 and the drain electrode 73. A photolithography process for the source electrode 72 and the drain electrode 73, an etching process for the source electrode 72 and the drain electrode 73, and a resist removal process are performed to form the source electrode 72 and the drain electrode 73. In addition to the molybdenum and aluminum films, a single-layer film made of tantalum, niobium, chromium, tungsten, or titanium, a stacked film thereof, or a metal film made of an alloy thereof can be used as the source electrode 72 and the drain electrode 73. The thickness of the film for the source electrode 72 and the drain electrode 73 is preferably in the range of 100 nm to 500 nm.

Annealing is performed at 400° C. for 1 hour to diffuse hydrogen from the source region 22 and the drain region 23 in the horizontal direction. The boundary between the channel region 21 and the source region 22 and the boundary between the channel region 21 and the drain region 23 are moved below the gate insulating film 3 and the gate electrode 4 by the diffusion of hydrogen. The top-gate oxide semiconductor TFT illustrated in FIGS. 2 and 3 is obtained by the above-mentioned processes. The annealing temperature is preferably equal to or higher than 300° C. in order to improve the electrical characteristics and quality of the interlayer insulating film 5.

In this embodiment, in the process of forming the interlayer insulating film 5, hydrogen is diffused to the oxide semiconductor layer 2, using the gate insulating film 3 thicker than the gate electrode 4 as a mask. The boundary between the channel region 21 and the source region 22 and the boundary between the channel region 21 and the drain region 23 are formed so as to be separated from the gate electrode 4. Therefore, it is possible to ensure the diffusion distance of hydrogen below the gate electrode 4 and to suppress an excessively large amount of hydrogen from being diffused below the gate electrode 4. As a result, it is possible to reduce the area of the overlap between the gate electrode 4 and the source region 22, or of the overlap between the gate electrode 4 and the drain region 23 and to reduce parasitic capacitance.

As described above, the interlayer insulating film 5 of the TFT illustrated in FIGS. 2 and 3 has good electrical characteristics and high density. Therefore, it is possible to improve the reliability of the TFT.

Figure 28:
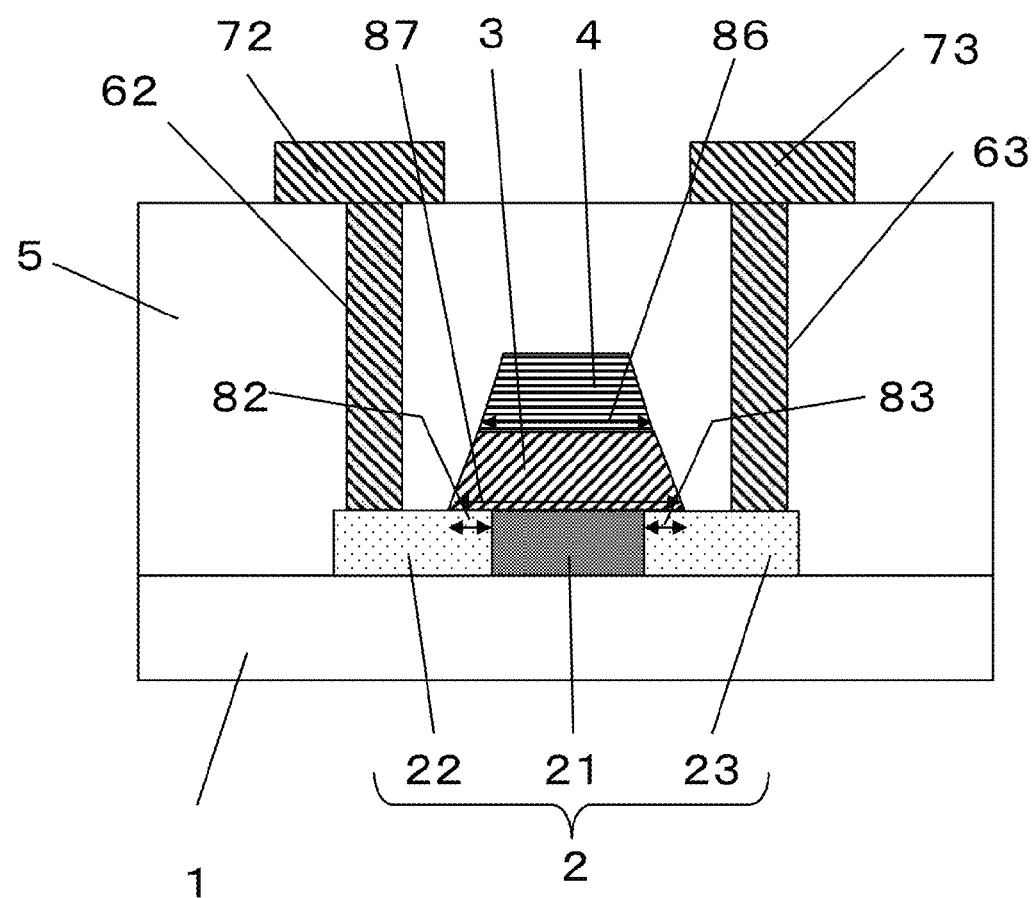
FIG. 28 is a cross-sectional view schematically illustrating a top-gate oxide semiconductor TFT according to Modification Example 1 of the invention.
Figure 29:
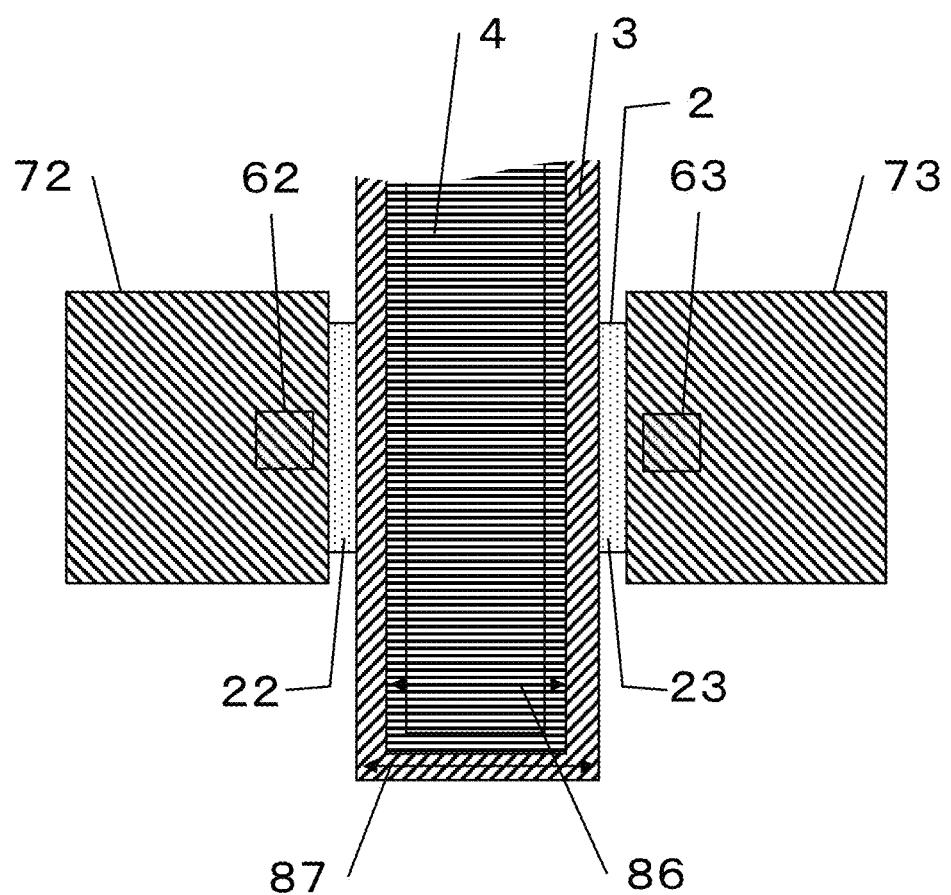
FIG. 29 is a plan view schematically illustrating the top-gate oxide semiconductor TFT according to Modification Example 1 of the invention.

Next, a top-gate oxide semiconductor TFT according to Modification Example 1 of the invention will be described. FIGS. 28 and 29 are a cross-sectional view and a plan view schematically illustrating the top-gate oxide semiconductor TFT according to Modification Example 1 of the invention, respectively. This modification example has the same structure as Embodiment 1 except for a gate electrode and a gate insulating film. The function and effect of this modification example are the same as those of Embodiment 1. Therefore, a difference in the gate electrode and the gate insulating film will be mainly described and the description of the other structures will not be repeated.

As illustrated in FIG. 28, a gate insulating film 3 which is a single-layer film, such as a silicon oxide film, an aluminum oxide film, a hafnium oxide film, a zirconium oxide film, an yttrium oxide film, a lanthanum oxide film, or a tantalum oxide film, or a stacked film thereof and has a single shape is formed in an island shape over an oxide semiconductor layer 2. In addition, the gate insulating film 3 has a forward tapered cross section. The forward tapered shape means a slope shape in which the width is reduced upward from a surface that is in contact with a substrate 1. Furthermore, the gate insulating film 3 is formed such that the length 87 of an interface with the oxide semiconductor layer 2 in the channel length direction is greater than the length 86 of an interface with a gate electrode 4, which will be described below, in the channel length direction. The length 87 in the channel length direction is greater than the width of a channel region 21 in the channel length direction.

The gate electrode 4 which is a single-layer film made of molybdenum, tantalum, niobium, chromium, tungsten, aluminum, or titanium, a stacked film thereof, or a metal film made of an alloy thereof is formed over the gate insulating film 3. The gate electrode 4 has a forward tapered cross section. The gate electrode 4 is formed such that the width thereof is less than that of the gate insulating film 3. That is, the length of the gate electrode 4 in the channel length direction is less than the length 86 of an interface with the gate insulating film 3 in the channel length direction. In this modification example, the gate insulating film 3 and the gate electrode 4 have a forward tapered cross section. Therefore, it is difficult to uniformly determine the distance from an end of the gate electrode at the source region side to an end of the gate insulating film at the source region side and the distance from an end of the gate electrode at the drain region side to an end of the gate insulating film at the drain region side. For this reason, the distances 84 and 85 are not illustrated in the drawings.

The other structures are the same as those in Embodiment 1. Therefore, it is possible to obtain a top-gate oxide semiconductor TFT with low parasitic capacitance and high reliability.

Figure 30:
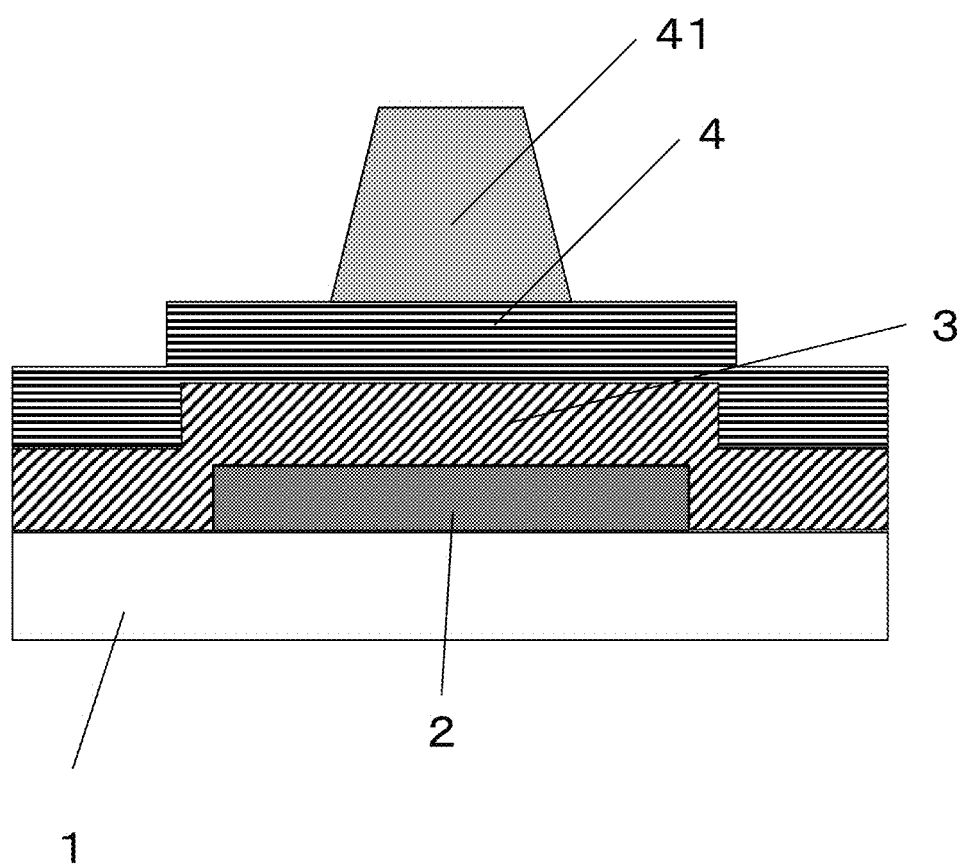
FIG. 30 is a cross-sectional view schematically illustrating each process for manufacturing the top-gate oxide semiconductor TFT according to Modification Example 1 of the invention.
Figure 31:
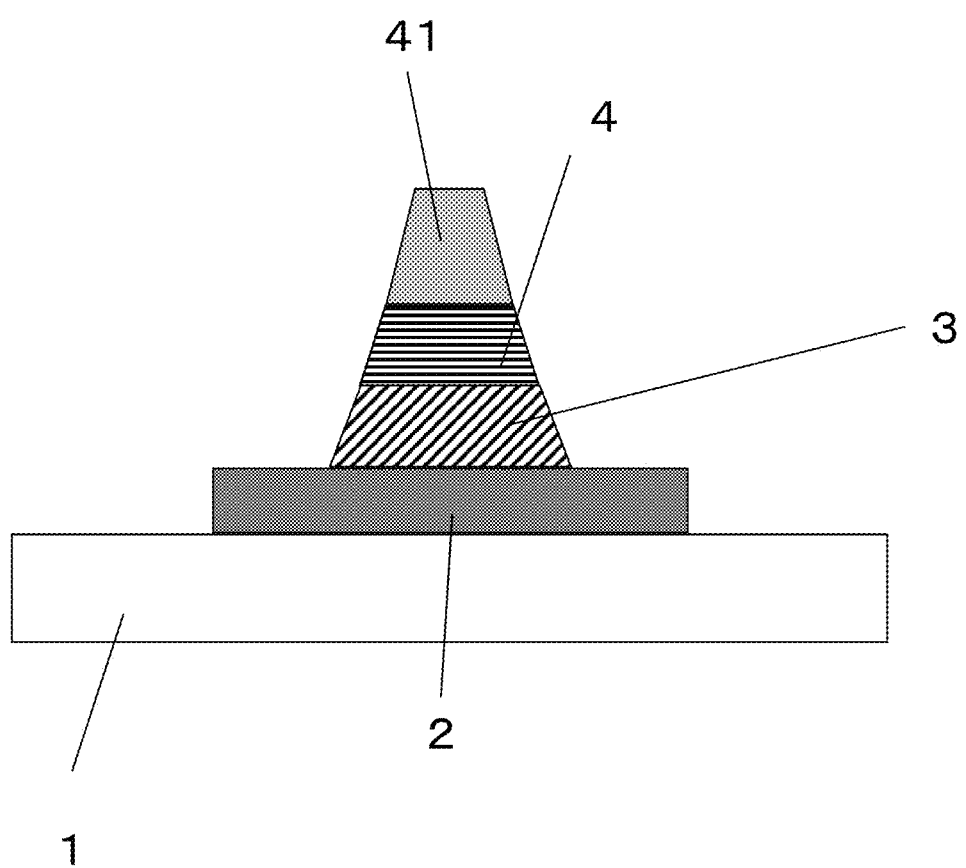
FIG. 31 is a cross-sectional view schematically illustrating each process for manufacturing the top-gate oxide semiconductor TFT according to Modification Example 1 of the invention.
Figure 32:
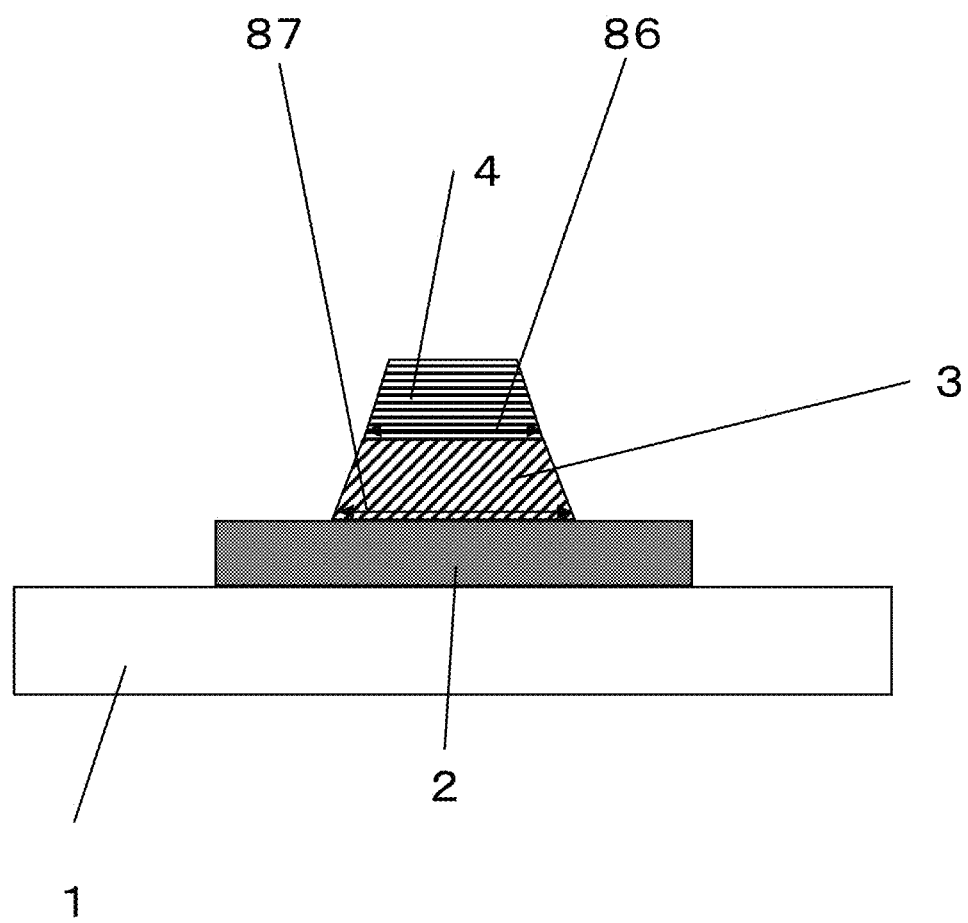
FIG. 32 is a cross-sectional view schematically illustrating each process for manufacturing the top-gate oxide semiconductor TFT according to Modification Example 1 of the invention.

Next, a method for manufacturing the TFT according to Modification Example 1 of the invention will be described. FIGS. 30 to 32 are cross-sectional views schematically illustrating each process for manufacturing the top-gate oxide semiconductor TFT according to Modification Example 1 of the invention. This modification example differs from Embodiment 1 in the cross-sectional structure of the gate electrode and the gate insulating film. Therefore, a difference in the process for manufacturing the gate electrode and the gate insulating film will be mainly described and the description of the other processes will not be repeated.

FIG. 30 will be described. A photolithography process is performed for the same structure as that illustrated in FIG. 5, in which the island-shaped oxide semiconductor layer 2 is formed over the glass substrate 1 and the gate insulating film 3 and the gate electrode 4 are formed over the oxide semiconductor layer 2, to form a resist pattern 41. The resist pattern 41 has a forward tapered cross section, as illustrated in FIG. 30.

As illustrated in FIG. 31, etching is performed along the resist pattern 41 to form the gate electrode 4 and the gate insulating film 3 in a forward tapered cross section. As the etching, dry etching may be performed while the resist pattern 41 is retreated.

As illustrated in FIG. 32, the resist pattern 41 is removed by a resist removal process. In this way, the gate insulating film 3 is formed in a single shape. The gate insulating film 3 has a forward tapered cross section. The gate insulating film 3 is formed such that the length 87 of an interface with the oxide semiconductor layer 2 in the channel length direction is greater than the length 86 of an interface of the gate electrode 4 with the gate insulating film 3 in the channel length direction.

After a process of forming an interlayer insulating film, the same processes as those in Embodiment 1 are performed to complete the TFT illustrated in FIGS. 28 and 29.

In this modification example, in the process of forming the interlayer insulating film 5, hydrogen is diffused to the oxide semiconductor layer 2, using the gate insulating film 3 thicker than the gate electrode 4 as a mask. Therefore, it is possible to improve the reliability of a TFT while reducing parasitic capacitance, similarly to Embodiment 1.

Embodiment 2

Figure 11:
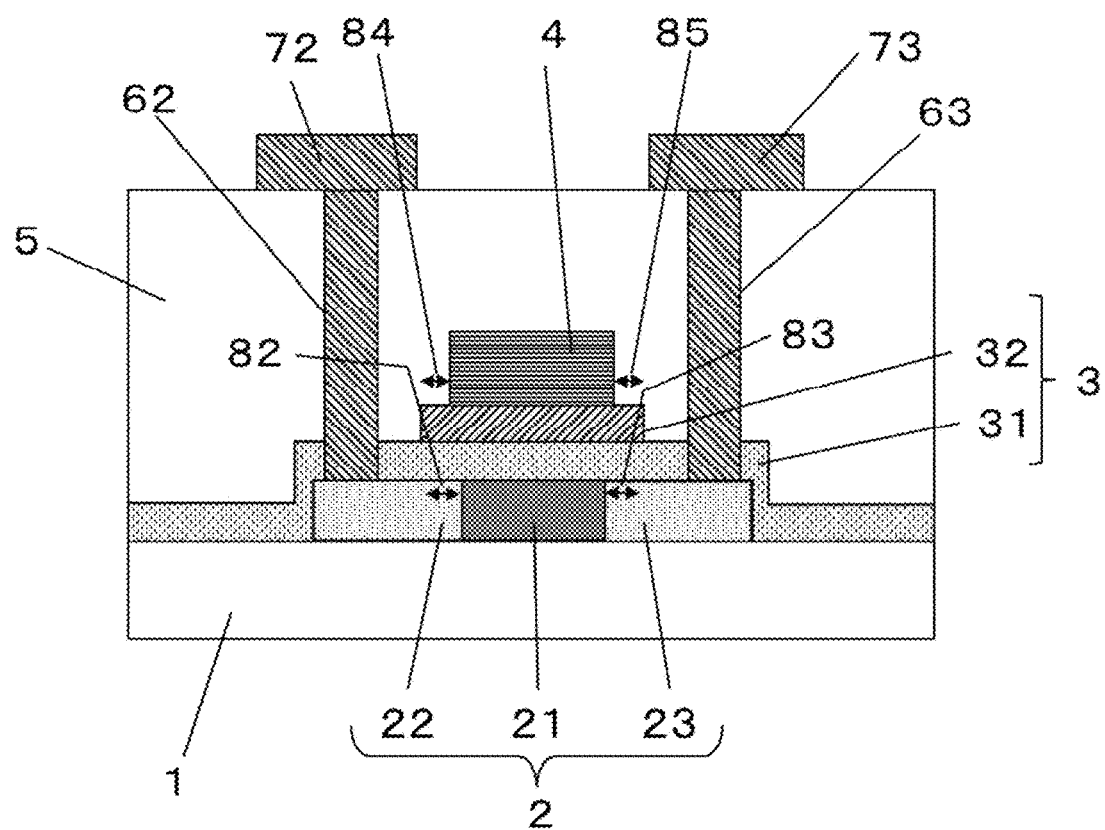
FIG. 11 is a cross-sectional view schematically illustrating a top-gate oxide semiconductor TFT according to Embodiment 2 of the invention.
Figure 12:
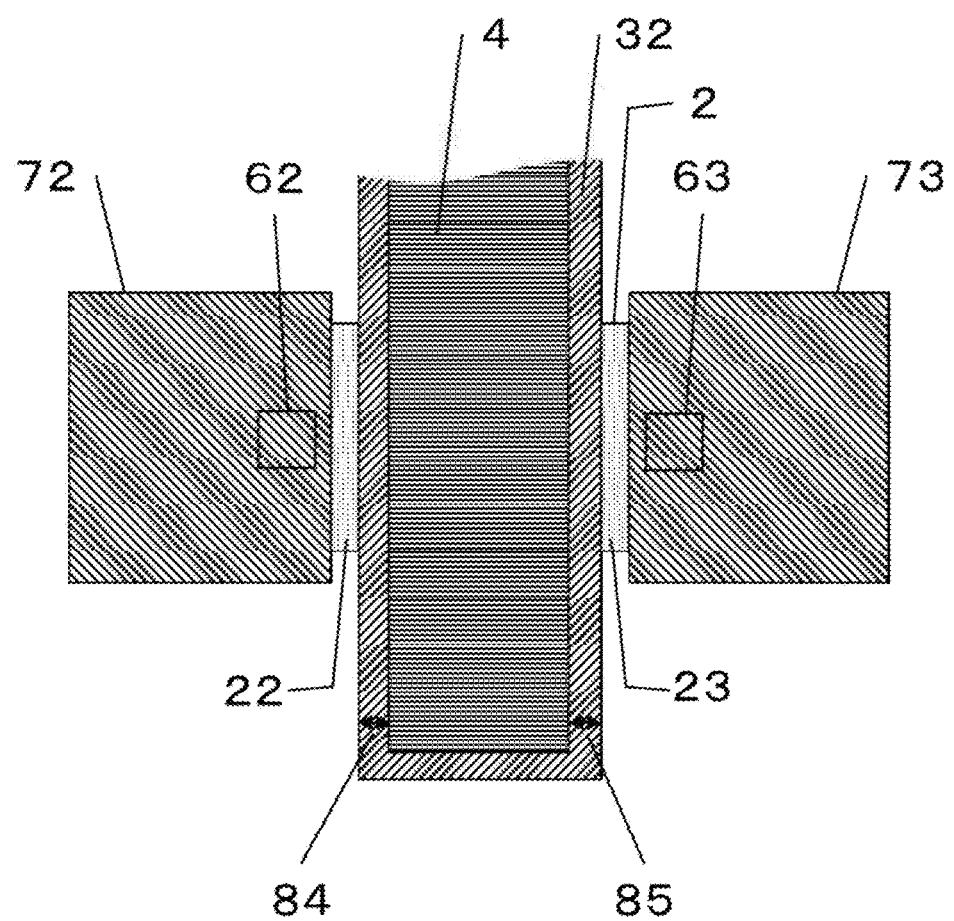
FIG. 12 is a plan view schematically illustrating the top-gate oxide semiconductor TFT according to Embodiment 2 of the invention.

Next, a top-gate oxide semiconductor TFT according to Embodiment 2 of the invention will be described. FIG. 11 is a cross-sectional view schematically illustrating the top-gate oxide semiconductor TFT according to Embodiment 2 of the invention. FIG. 12 is a plan view schematically illustrating the top-gate oxide semiconductor TFT according to Embodiment 2 of the invention. This embodiment differs from Embodiment 1 in that the gate insulating film 3 has two different shapes. Therefore, a difference in the gate insulating film 3 will be mainly described and the description of the other structures will not be repeated.

As illustrated in FIG. 11, the gate insulating film 3 which is a single-layer film, such as a silicon oxide film, an aluminum oxide film, a hafnium oxide film, a zirconium oxide film, an yttrium oxide film, a lanthanum oxide film, or a tantalum oxide film, or a stacked film thereof and has two different shapes is formed over an oxide semiconductor layer 2. A portion of the gate insulating film 3 is removed.

A first gate insulating film 31 located at the lower side in a thickness direction and has a first shape covers the entire oxide semiconductor layer 2. A second gate insulating film 32 located at the upper side in the thickness direction and has a second shape is formed such that the length thereof in the channel length direction is greater than the width of a gate electrode 4 in the channel length direction and is greater than the width of a channel region 21 in the channel length direction. In other words, the gate insulating film 3 has two shapes and a minimum gate insulating film, which has the smallest size among the gate insulating films, that is, the second gate insulating film 32 is provided such that the length thereof in the channel length direction is greater than the width of the gate electrode 4 in the channel length direction and is greater than the width of the channel region 21 in the channel length direction. In other words, the second gate insulating film 32 is a patterned gate insulating film.

When an interlayer insulating film 5 is formed, hydrogen is diffused using the second gate insulating film 32 as a mask. Therefore, a source region 22 or a drain region 23 is formed at a position where the second gate insulating film 32 is removed. The channel region 21 is formed at a position below the second gate insulating film 32 where the diffusion of hydrogen is suppressed. That is, the channel region 21, the source region 22, and the drain region 23 are formed with respect to the second gate insulating film 32 by self-alignment. Since the second gate insulating film 32 is formed so as to be longer than the gate electrode 4 in the channel length direction, the boundary between the channel region 21 and the source region 22 and the boundary between the channel region 21 and the drain region 23 are formed at the position that is separated from the gate electrode 4 during the formation of the interlayer insulating film 5. Therefore, it is possible to ensure the diffusion distance of hydrogen below the gate electrode 4 and to suppress an excessively large amount of hydrogen from being diffused below the gate electrode 4. As a result, it is possible to reduce the area of the overlap between the gate electrode 4 and the source region 22, or of the overlap between the gate electrode 4 and the drain region 23 and to reduce parasitic capacitance.

Since the diffusion distance of hydrogen below the gate electrode 4 can be ensured, it is possible to perform the formation of the interlayer insulating film 5 and annealing at a high temperature. Therefore, it is possible to improve the electrical characteristics and quality of the interlayer insulating film 5 and to improve the reliability of a TFT.

In this embodiment, when the interlayer insulating film 5 is formed, hydrogen is diffused, using the second gate insulating film 32 as a mask, and the source region 22 and the drain region 23 are formed by self-alignment. Then, hydrogen is diffused from the source region 22 and the drain region 23 in the horizontal direction by annealing. Therefore, a distance 82 from an end of the second gate insulating film 32 at the source region 22 side to the boundary between the source region 22 and the channel region 21 is substantially equal to a distance 83 from an end of the second gate insulating film 32 at the drain region 23 side to the boundary between the drain region 23 and the channel region 21.

In addition, the boundary between the channel region 21 and the source region 22 and the boundary between the channel region 21 and the drain region 23 are formed below the second gate insulating film 32 and the gate electrode 4 by the diffusion of hydrogen by annealing. Therefore, the TFT has a single drain structure and it is possible to obtain a high on-current. In this case, as illustrated in FIGS. 11 and 12, when the gate electrode 4 is also formed with respect to the second gate insulating film 32 by self-alignment, it is possible to reduce the positional deviation between the gate electrode 4, and the channel region 21, the source region 22, and the drain region 23. As a result, it is possible to uniformly manufacture the TFT in which the area of the overlap between the gate electrode 4, and the source region 22 and the drain region 23 is small. As such, when the gate electrode 4 is also formed with respect to the gate insulating film 3 by self-alignment, a distance 84 from an end of the gate electrode 4 at the source region 22 side to an end of the second gate insulating film 32 at the source region 22 side is substantially equal to a distance 85 from an end of the gate electrode 4 at the drain region 23 side to an end of the second gate insulating film 32 at the drain region 23 side.

In this embodiment, since the entire oxide semiconductor layer 2 is covered with the first gate insulating film 31, the interface between the first gate insulating film 31 and the oxide semiconductor layer 2 is not exposed to an etchant and a resist remover when the second gate insulating film 32 and the gate electrode 4 are etched. Therefore, it is possible to prevent the contamination of the oxide semiconductor layer 2. As a result, it is possible to further improve the reliability of the TFT while maintaining good electrical characteristics.

According to the above-mentioned structure, it is possible to obtain a top-gate oxide semiconductor TFT with low parasitic capacitance and high reliability.

A method for manufacturing the TFT according to this embodiment will be described. FIGS. 13 to 17 are cross-sectional views schematically illustrating each process for manufacturing the top-gate oxide semiconductor TFT according to Embodiment 2 of the invention. This embodiment differs from Embodiment 1 in the planar structure of the gate insulating film 3. Therefore, a difference in the process for manufacturing the gate insulating film 3 will be mainly described and the description of the other processes will not be repeated.

Figure 13:
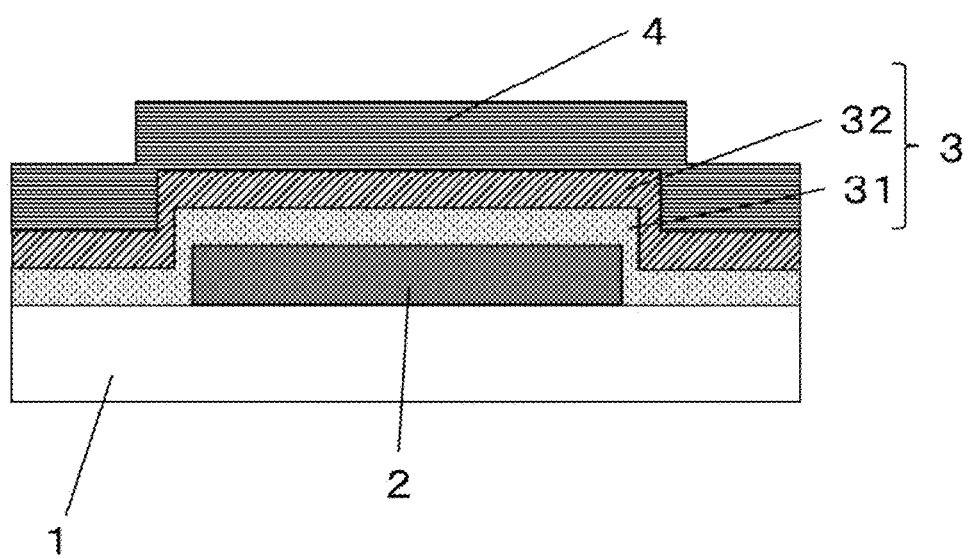
FIG. 13 is a cross-sectional view schematically illustrating each process for manufacturing the top-gate oxide semiconductor TFT according to Embodiment 2 of the invention.

FIG. 13 will be described. Similarly to Embodiment 1, an island-shaped pattern of the oxide semiconductor layer 2 is formed over the glass substrate 1. As the first gate insulating film 31, a silicon oxide film with a thickness of 100 nm is formed by PECVD. As the second gate insulating film 32, an aluminum oxide film with a thickness of 50 nm is formed by ALD. A molybdenum film with a thickness of 100 nm is formed as a gate electrode material over the second gate insulating film 32 by sputtering.

In addition to the silicon oxide film or the aluminum oxide film, a single-layer film, such as a hafnium oxide film, a zirconium oxide film, an yttrium oxide film, a lanthanum oxide film, or a tantalum oxide film, or a stacked film thereof may be used as the first gate insulating film 31 and the second gate insulating film 32. The first gate insulating film 31 should not hinder the diffusion of hydrogen when the interlayer insulating film 5, which will be described below, is formed. Therefore, when a silicon oxide film formed by PECVD is used, the thickness of the silicon oxide film is preferably equal to or less than 100 nm. It is preferable that the second gate insulating film 32 include an aluminum oxide film, a hafnium oxide film, a zirconium oxide film, an yttrium oxide film, a lanthanum oxide film, or a tantalum oxide film with a thickness of 50 nm or more. In this case, it is possible to particularly suppress the diffusion of hydrogen when the interlayer insulating film 5, which will be described below, is formed. For example, PECVD, sputtering, and ALD can be used as these deposition methods. However, it is preferable to use ALD as the deposition method in terms of the diffusion of hydrogen to the oxide semiconductor layer 2 and damage caused by ion bombardment.

Figure 14:
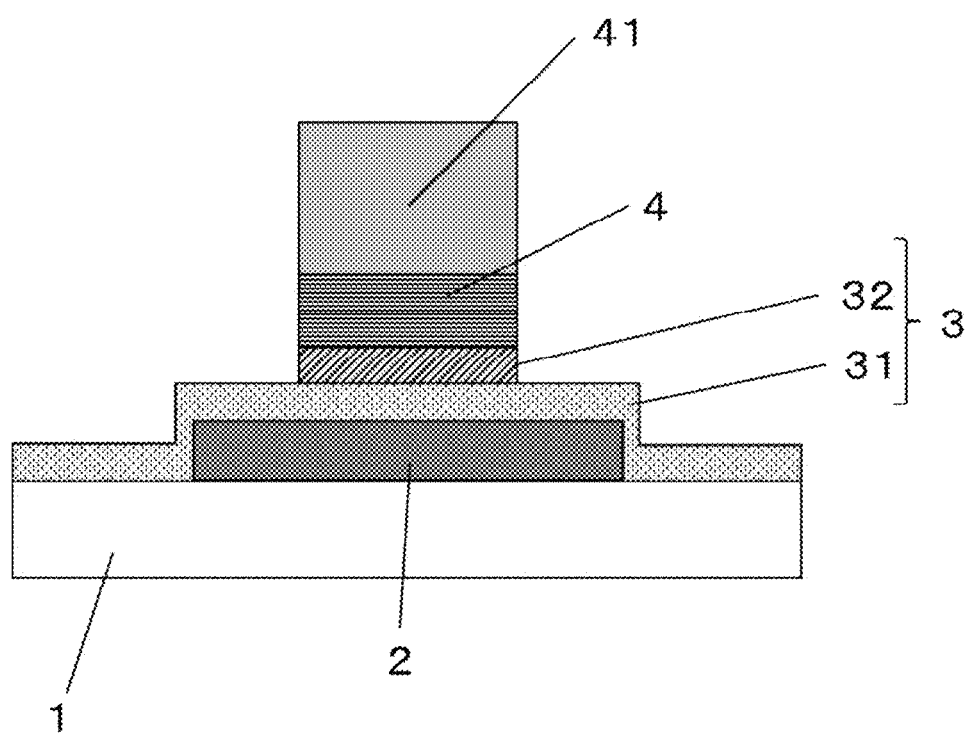
FIG. 14 is a cross-sectional view schematically illustrating each process for manufacturing the top-gate oxide semiconductor TFT according to Embodiment 2 of the invention.

FIG. 14 will be described. A photolithography process is performed to form a resist pattern 41. Etching is performed along the resist pattern 41 to form the gate electrode 4 and the second gate insulating film 32. In this case, the first gate insulating film 31 remains without being etched.

Figure 15:
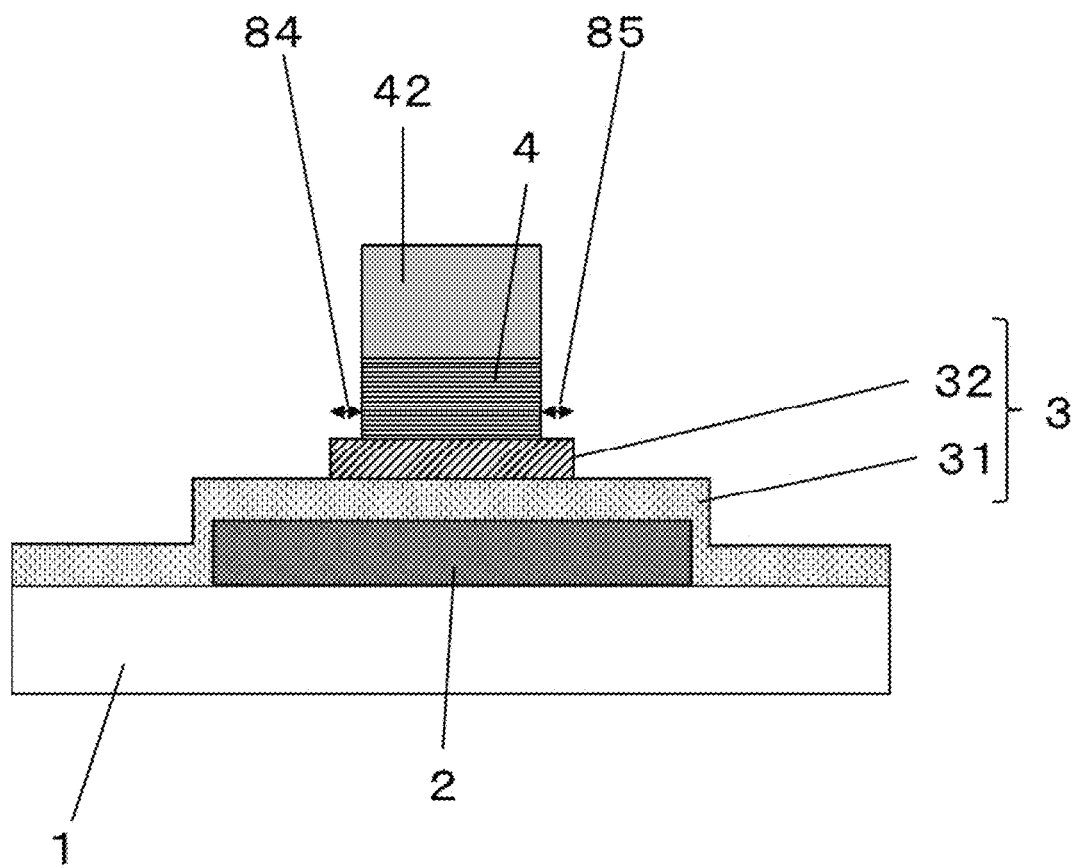
FIG. 15 is a cross-sectional view schematically illustrating each process for manufacturing the top-gate oxide semiconductor TFT according to Embodiment 2 of the invention.

FIG. 15 will be described. Ashing is performed to reduce the width of the resist pattern 41 by 0.5 µm at one side, thereby forming a resist pattern 42. The gate electrode 4 is etched along the resist pattern 42. It is preferable that the resist pattern 42 be formed by reducing the width of the resist pattern 41 by a value corresponding to the diffusion distance of hydrogen by the formation of the interlayer insulating film 5, which will be described below, and the subsequent annealing process.

Figure 16:
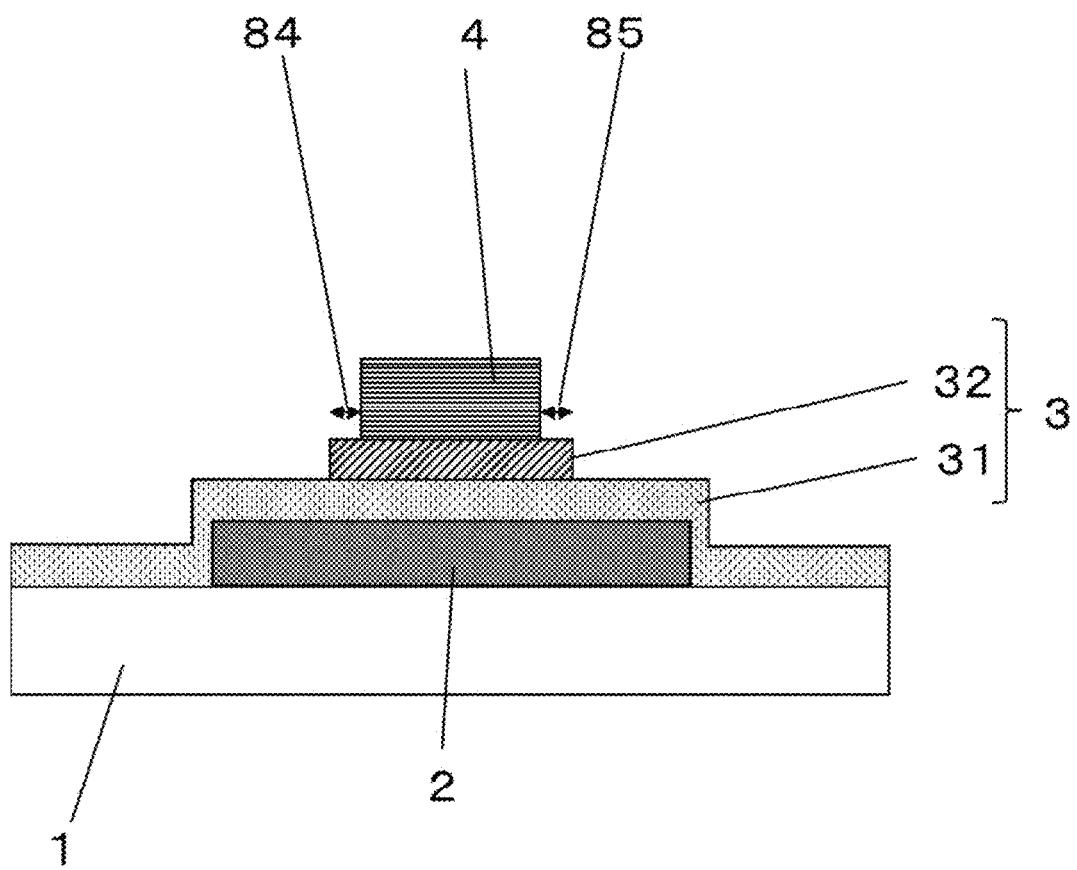
FIG. 16 is a cross-sectional view schematically illustrating each process for manufacturing the top-gate oxide semiconductor TFT according to Embodiment 2 of the invention.

FIG. 16 will be described. The resist pattern 42 is removed by a resist removal process. In this way, the gate insulating film 3 including two layers, that is, the first gate insulating film 31 that is in contact with the oxide semiconductor layer 2 and the second gate insulating film 32 that is in contact with the gate electrode 4 is formed. The length of the second gate insulating film 32 in the channel length direction is greater than the width of the gate electrode 4 in the channel length direction.

In this embodiment, the entire oxide semiconductor layer 2 is covered with the first gate insulating film 31. Therefore, the interface between the first gate insulating film 31 and the oxide semiconductor layer 2 is not exposed to an etchant and a resist remover in the etching process for the second gate insulating film 32 and the gate electrode 4 and the resist removal process and it is possible to prevent the contamination of the oxide semiconductor layer 2. As a result, it is possible to further improve the reliability of the TFT while maintaining good electrical characteristics of the oxide semiconductor layer 2.

In the process illustrated in FIGS. 12 to 16, since the gate electrode 4 and the second gate insulating film 32 are formed by self-alignment, the width of the resist pattern 41 is reduced by ashing to form the resist pattern 42. When this process is employed, the distance 84 from the end of the gate electrode 4 at the source region 22 side to the end of the second gate insulating film 32 at the source region side 22 is substantially equal to the distance 85 from the end of the gate electrode 4 at the drain region 23 side to the end of the second gate insulating film 32 at the drain region 23 side. The resist pattern 41 and the resist pattern 42 may be individually manufactured by the photolithography process.

Figure 17:
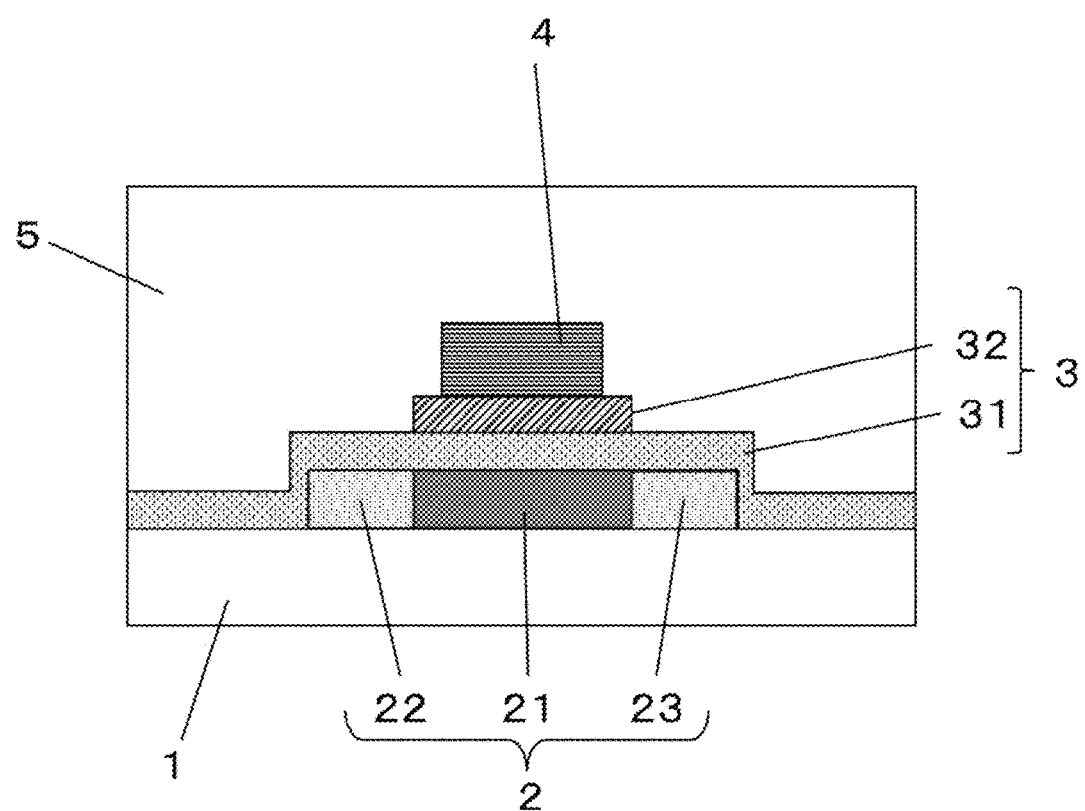
FIG. 17 is a cross-sectional view schematically illustrating each process for manufacturing the top-gate oxide semiconductor TFT according to Embodiment 2 of the invention.

FIG. 17 will be described. As the interlayer insulating film 5, a silicon oxide film with a thickness of 300 nm is formed by PECVD. When the interlayer insulating film 5 is formed, hydrogen is diffused to a portion of the oxide semiconductor layer 2 which is not covered with the second gate insulating film 32 to form the source region 22 and the drain region 23. Therefore, the hydrogen concentration of the source region 22 and the drain region 23 is higher than that of the channel region 21. The difference between the hydrogen concentrations is preferably equal to or greater than $2 \times 10^{20}$ cm$^{-3}$.

The length of the second gate insulating film 32, which is used as a mask when hydrogen is diffused to the oxide semiconductor layer 2, in the channel length direction is greater than the width of the gate electrode 4 in the channel length direction. Therefore, the boundary between the channel region 21 and the source region 22 and the boundary between the channel region 21 and the drain region 23 are formed as to be separated from the gate electrode 4. Since the diffusion distance of hydrogen below the gate electrode 4 can be ensured, it is possible to form the interlayer insulating film 5 at a high temperature of 300° C. or higher. Therefore, it is easy to obtain the interlayer insulating film 5 with good electrical characteristics and high density.

Similarly to Embodiment 1, a source-side contact hole 62, a drain-side contact hole 63, a source electrode 72, and a drain electrode 73 are formed. Finally, annealing is performed at 400° C. for 1 hour. Then, hydrogen is diffused from the source region 22 and the drain region 23 in the horizontal direction and the boundary between the channel region 21 and the source region 22 and the boundary between the channel region 21 and the drain region 23 are moved below the second gate insulating film 32 and the gate electrode 4. The top-gate oxide semiconductor TFT illustrated in FIG. 11 is completed by the above-mentioned processes.

In this embodiment, when the interlayer insulating film 5 is formed, hydrogen is diffused to the oxide semiconductor layer 2, using the second gate insulating film 32, of which the length in the channel length direction is greater than the width of the gate electrode 4 in the channel length direction, as a mask. The boundary between the channel region 21 and the source region 22 and the boundary between the channel region 21 and the drain region 23 are formed so as to be separated from the gate electrode 4. Therefore, it is possible to ensure the diffusion distance of hydrogen below the gate electrode 4 and to suppress an excessively large amount of hydrogen from being diffused below the gate electrode 4. As a result, it is possible to reduce the area of the overlap between the gate electrode 4 and the source region 22, or of the overlap between the gate electrode 4 and the drain region 23 and to reduce parasitic capacitance.

As described above, since the interlayer insulating film 5 according to this embodiment has good electrical characteristics and high density, it is possible to improve the reliability of the TFT.

Embodiment 3

Figure 18:
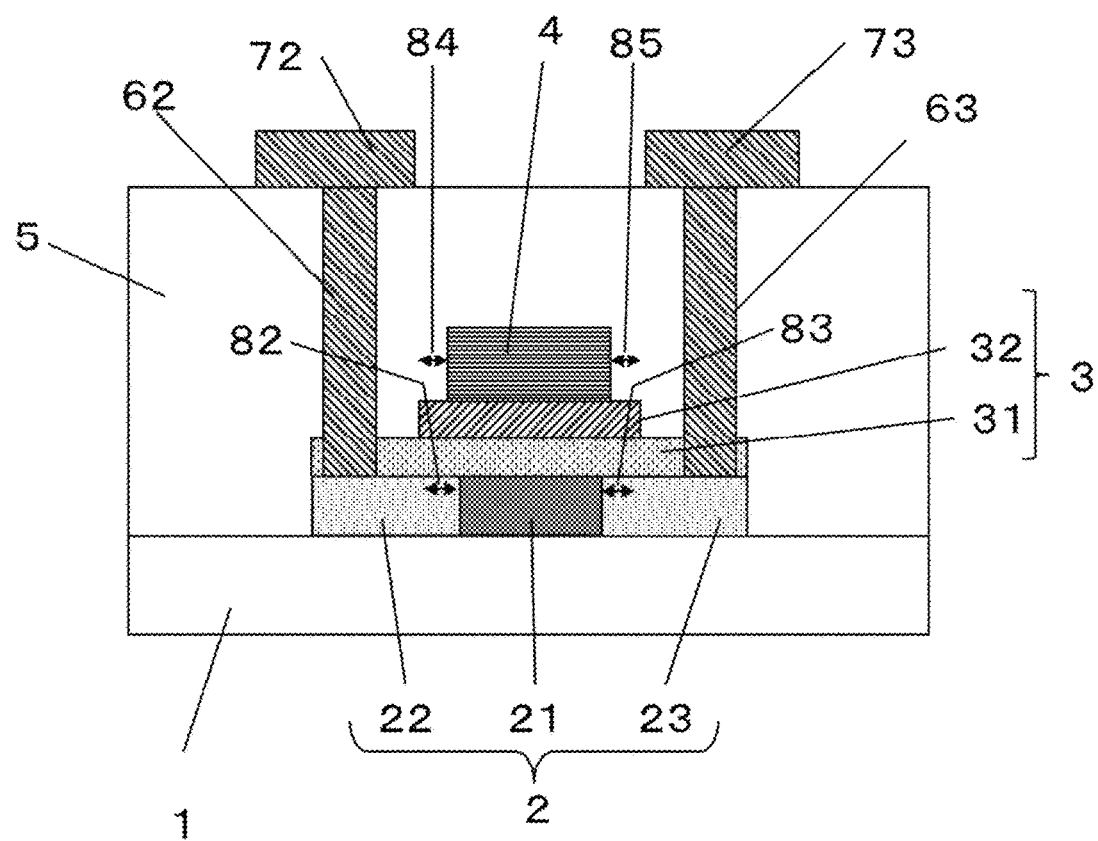
FIG. 18 is a cross-sectional view schematically illustrating a top-gate oxide semiconductor TFT according to Embodiment 3 of the invention.
Figure 19:
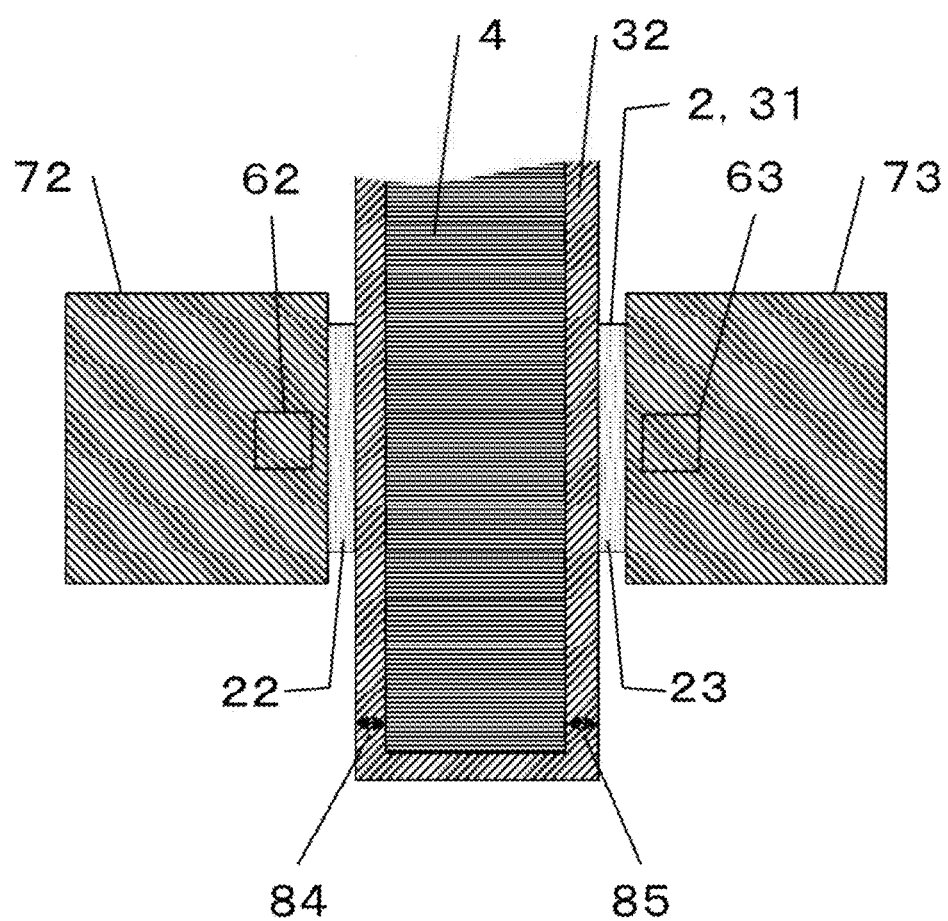
FIG. 19 is a plan view schematically illustrating the top-gate oxide semiconductor TFT according to Embodiment 3 of the invention.

FIG. 18 is a cross-sectional view schematically illustrating a top-gate oxide semiconductor TFT according to Embodiment 3 of the invention. FIG. 19 is a plan view schematically illustrating the top-gate oxide semiconductor TFT according to Embodiment 3 of the invention. This embodiment differs from Embodiment 2 in that the first gate insulating film 31 has the same planar shape as the oxide semiconductor layer 2. Therefore, a difference in a process for manufacturing a gate insulating film 3 will be mainly described and the description of the other structures will not be repeated.

As illustrated in FIG. 18, the gate insulating film 3 which is a single-layer film, such as a silicon oxide film, an aluminum oxide film, a hafnium oxide film, a zirconium oxide film, an yttrium oxide film, a lanthanum oxide film, or a tantalum oxide film, or a stacked film thereof and has two different shapes is formed over the oxide semiconductor layer 2. A portion of the gate insulating film 3 is removed.

The first gate insulating film 31 located at the lower side in a thickness direction and has a first shape covers the entire surface of the oxide semiconductor layer 2, but does not cover the end of the oxide semiconductor layer 2. The second gate insulating film 32 located at the upper side in the thickness direction and has a second shape is formed such that the length thereof in the channel length direction is greater than the width of a gate electrode 4 in the channel length direction and is greater than the width of a channel region 21 in the channel length direction. In other words, the gate insulating film 3 has two shapes and a minimum gate insulating film, which has the smallest size among the gate insulating films, that is, the second gate insulating film 32 is provided such that the length thereof in the channel length direction is greater than the width of the gate electrode 4 in the channel length direction and is greater than the width of the channel region 21 in the channel length direction. In other words, the second gate insulating film 32 is a patterned gate insulating film.

A distance 82 from an end of the second gate insulating film 32 at the source region 22 side to the boundary between the source region 22 and the channel region 21 is substantially equal to a distance 83 from an end of the second gate insulating film 32 at the drain region 23 side to the boundary between the drain region 23 and the channel region 21.

The other structures are the same as those in Embodiment 2 and it is possible to obtain a top-gate oxide semiconductor TFT with low parasitic capacitance and high reliability.

In this embodiment, the entire oxide semiconductor layer 2 is covered with the first gate insulating film 31, similarly to Embodiment 2. Therefore, the interface between the first gate insulating film 31 and the oxide semiconductor layer 2 is not exposed to an etchant and a resist remover in an etching process for the second gate insulating film 32 and the gate electrode 4 and a resist removal process and it is possible to prevent the contamination of the oxide semiconductor layer 2.

In addition, the interface between the first gate insulating film 31 and the oxide semiconductor layer 2 is not exposed to a resist and a resist remover when the oxide semiconductor layer 2 is etched. Therefore, it is possible to further prevent the contamination of the oxide semiconductor layer 2, as compared to Embodiment 2. As a result, it is possible to maintain good electrical characteristics and to further improve the reliability of the TFT.

Next, a method for manufacturing the TFT according to this embodiment will be described. FIGS. 20 to 23 are cross-sectional views schematically illustrating each process for manufacturing the top-gate oxide semiconductor TFT according to Example 3 of the invention. This embodiment differs from Embodiment 2 in the planar structure of the first gate insulating film 31. Therefore, a difference in a process for manufacturing the first gate insulating film 31 will be mainly described and the description of the other processes will not be repeated.

Figure 20:
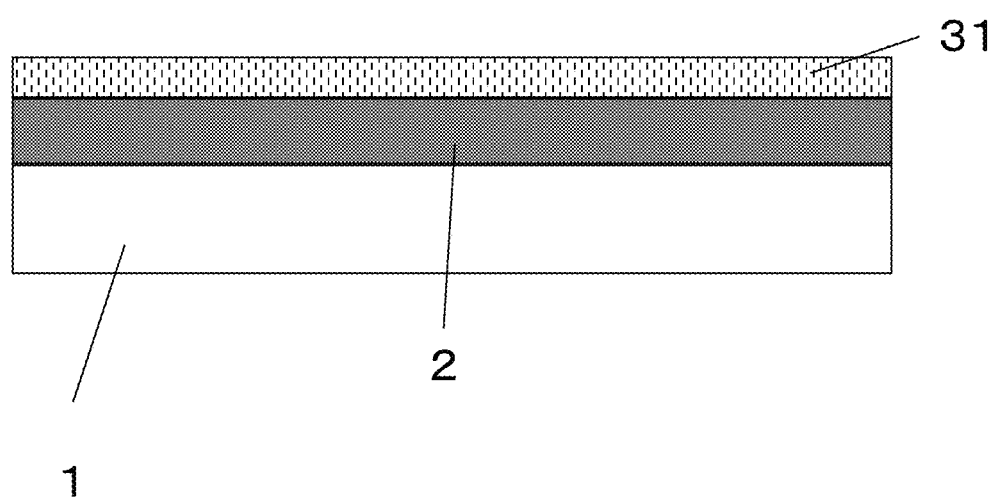
FIG. 20 is a cross-sectional view schematically illustrating each process for manufacturing the top-gate oxide semiconductor TFT according to Embodiment 3 of the invention.

FIG. 20 will be described. The oxide semiconductor layer 2 is formed over the glass substrate 1. As the first gate insulating film 31, a silicon oxide film with a thickness of 100 nm is formed by PECVD. In addition to the silicon oxide film, a single-layer film, such as an aluminum oxide film, a hafnium oxide film, a zirconium oxide film, an yttrium oxide film, a lanthanum oxide film, or a tantalum oxide film, or a stacked film thereof may be used as the first gate insulating film 31. The first gate insulating film 31 should not hinder the diffusion of hydrogen when the interlayer insulating film 5, which will be described below, is formed. Therefore, when a silicon oxide film formed by PECVD is used, the thickness of the silicon oxide film is preferably equal to or less than 100 nm.

Figure 21:
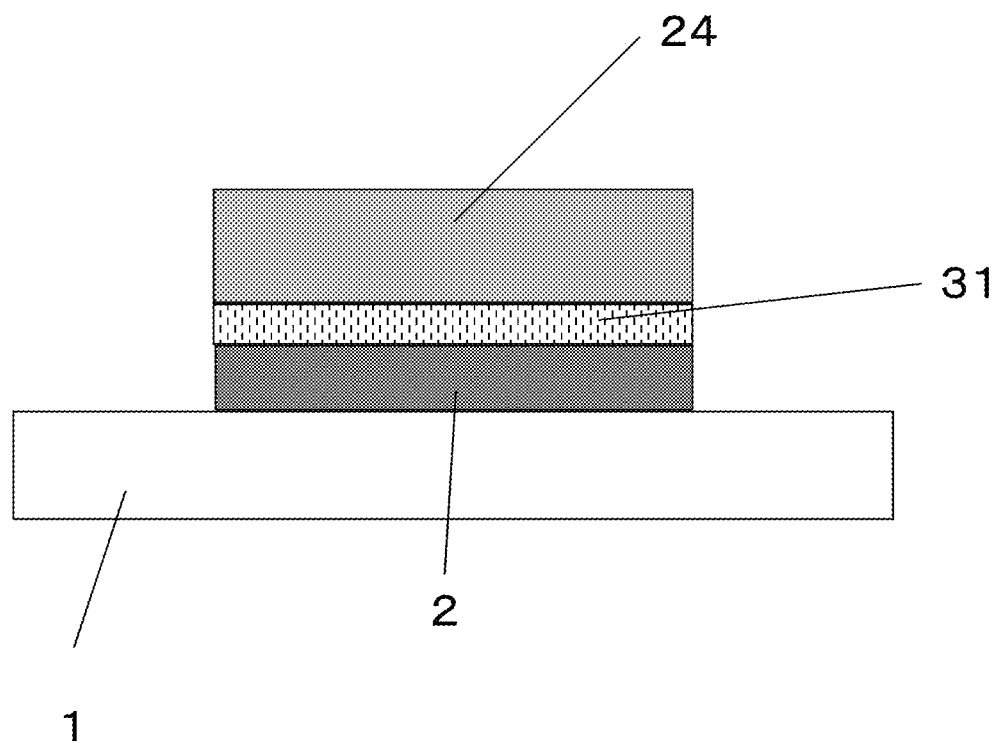
FIG. 21 is a cross-sectional view schematically illustrating each process for manufacturing the top-gate oxide semiconductor TFT according to Embodiment 3 of the invention.

FIG. 21 will be described. A photolithography process is performed to form a resist pattern 24. Etching is performed along the resist pattern 24 to form the first gate insulating film 31 and the oxide semiconductor layer 2. As such, since the first gate insulating film 31 is formed over the oxide semiconductor layer 2 and etching is performed, the interface between the first gate insulating film 31 and the oxide semiconductor layer 2 is not exposed to a resist and a resist remover when the oxide semiconductor layer 2 is etched. Therefore, it is possible to further prevent the contamination of the oxide semiconductor layer 2, as compared to Embodiment 2.

Figure 22:
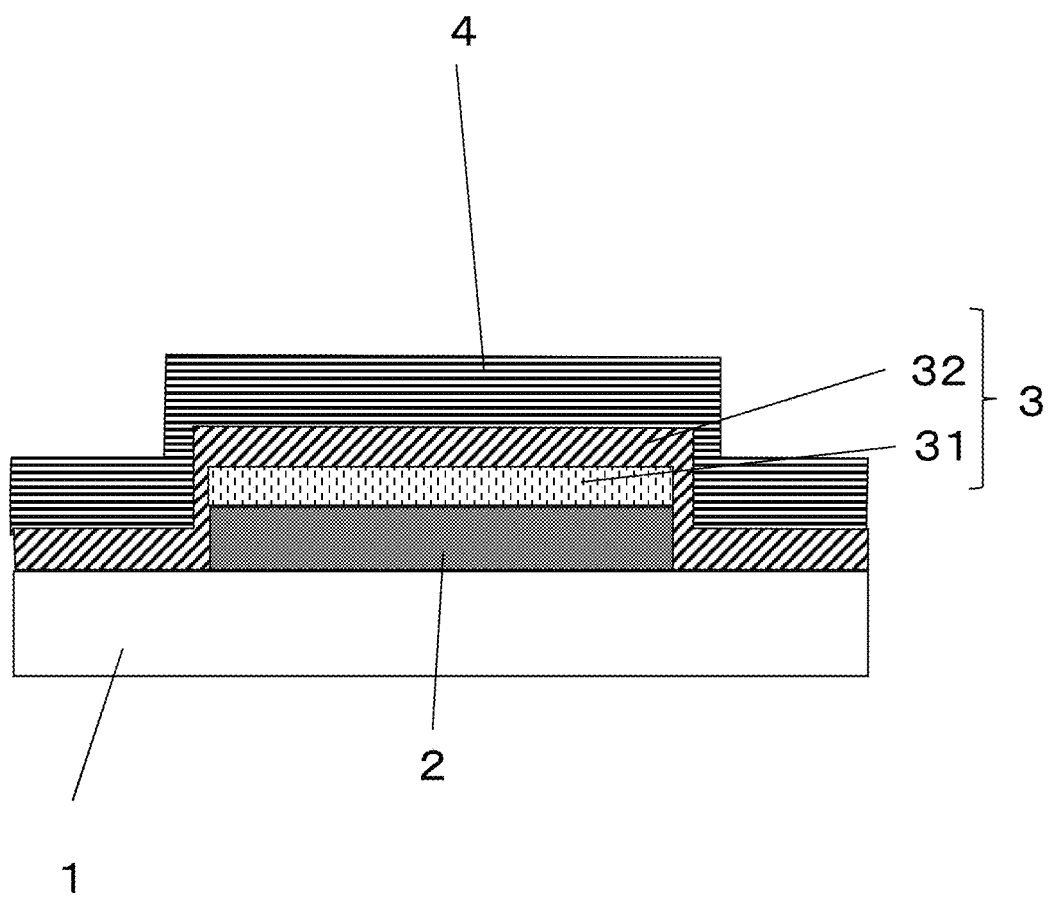
FIG. 22 is a cross-sectional view schematically illustrating each process for manufacturing the top-gate oxide semiconductor TFT according to Embodiment 3 of the invention.

FIG. 22 will be described. The resist pattern 24 is removed by a resist removal process. As the second gate insulating film 32, an aluminum oxide film with a thickness of 50 nm is formed by ALD. A molybdenum film with a thickness of 100 nm is formed as a gate electrode material over the second gate insulating film 32 by sputtering. In addition to the aluminum oxide film, a single-layer film, such as a silicon oxide film, a hafnium oxide film, a zirconium oxide film, an yttrium oxide film, a lanthanum oxide film, or a tantalum oxide film, or a stacked film thereof may be used as the second gate insulating film 32. It is preferable that the second gate insulating film 32 include an aluminum oxide film, a hafnium oxide film, a zirconium oxide film, an yttrium oxide film, a lanthanum oxide film, or a tantalum oxide film with a thickness of 50 nm or more. In this case, it is possible to particularly suppress the diffusion of hydrogen when the interlayer insulating film 5, which will be described below, is formed. For example, PECVD, sputtering, and ALD can be used as these deposition methods. However, it is preferable to use ALD as the deposition method in terms of the diffusion of hydrogen to the oxide semiconductor layer 2 and damage caused by ion bombardment.

Figure 23:
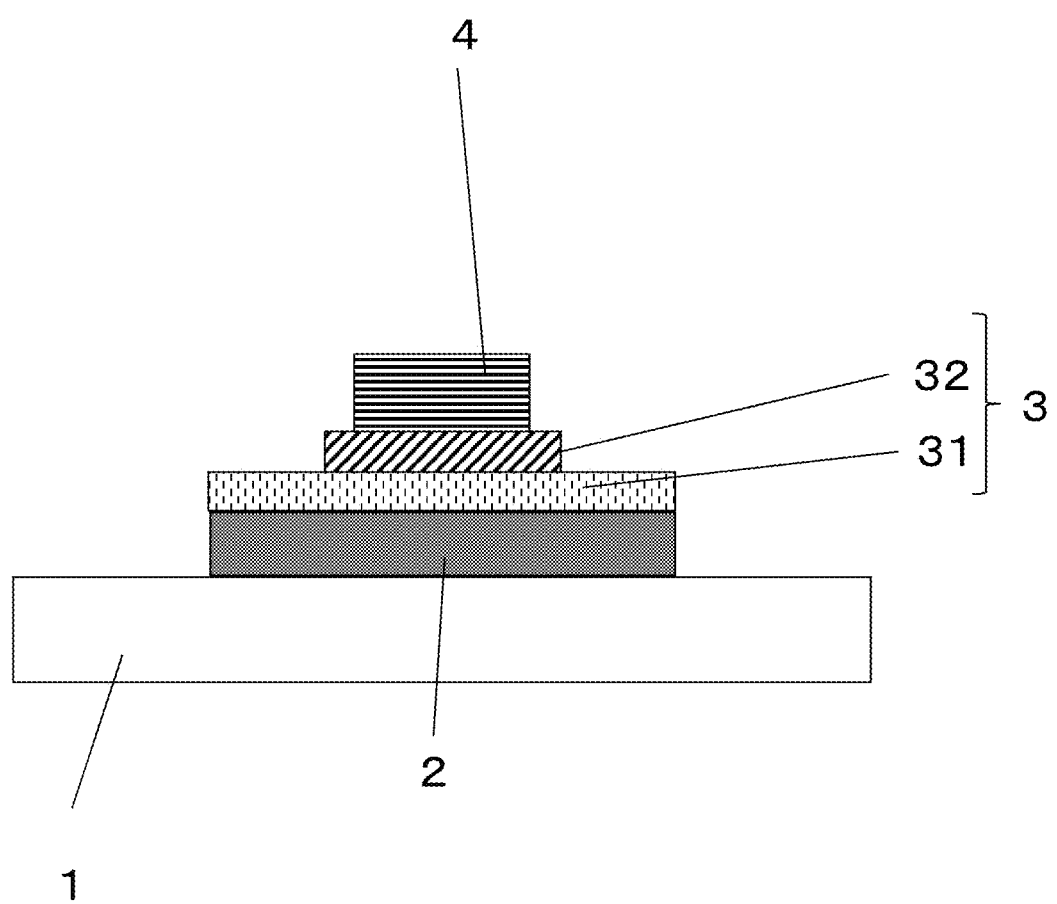
FIG. 23 is a cross-sectional view schematically illustrating each process for manufacturing the top-gate oxide semiconductor TFT according to Embodiment 3 of the invention.

FIG. 23 will be described. Similarly to Embodiment 2, photolithography and etching are performed to form the second gate insulating film 32 and the gate electrode 4. That is, the gate insulating film 3 including two layers, that is, the first gate insulating film 31 that is in contact with the oxide semiconductor layer 2 and the second gate insulating film 32 that is in contact with the gate electrode 4 is formed. The length of the second gate insulating film 32 in the channel length direction is greater than the width of the gate electrode 4 in the channel length direction.

Then, the same processes as those in Embodiment 2 are performed to complete the TFT illustrated in FIGS. 18 and 19. The hydrogen concentration of the source region 22 and the drain region 23 is higher than that of the channel region 21. Similarly to Embodiment 2, the difference between the hydrogen concentrations is preferably equal to or greater than $2 \times 10^{20}$ cm$^{-3}$.

In this embodiment, the first gate insulating film 31 covers the entire surface of the oxide semiconductor layer 2. Therefore, the interface between the first gate insulating film 31 and the oxide semiconductor layer 2 is not exposed to an etchant and a resist remover in the etching process for the second gate insulating film 32 and the gate electrode 4 and the resist removal process, similarly to Embodiment 2. As a result, it is possible to prevent the contamination of the oxide semiconductor layer 2.

In addition, the interface between the first gate insulating film 31 and the oxide semiconductor layer 2 is not exposed to a resist and a resist remover when the oxide semiconductor layer 2 is etched. Therefore, it is possible to further prevent the contamination of the oxide semiconductor layer 2, as compared to Embodiment 2. As a result, it is possible to maintain good electrical characteristics and to further improve the reliability of the TFT.

Figure 33:
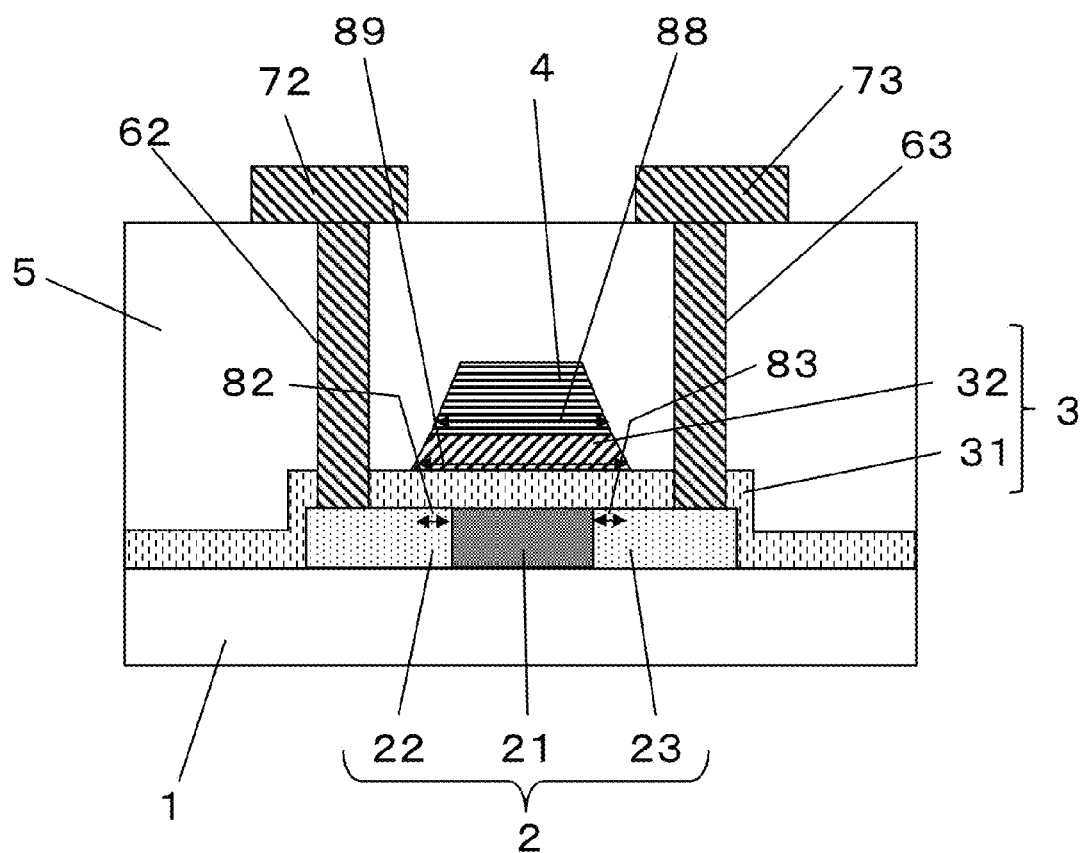
FIG. 33 is a cross-sectional view schematically illustrating a top-gate oxide semiconductor TFT according to Modification Example 2 of the invention.
Figure 34:
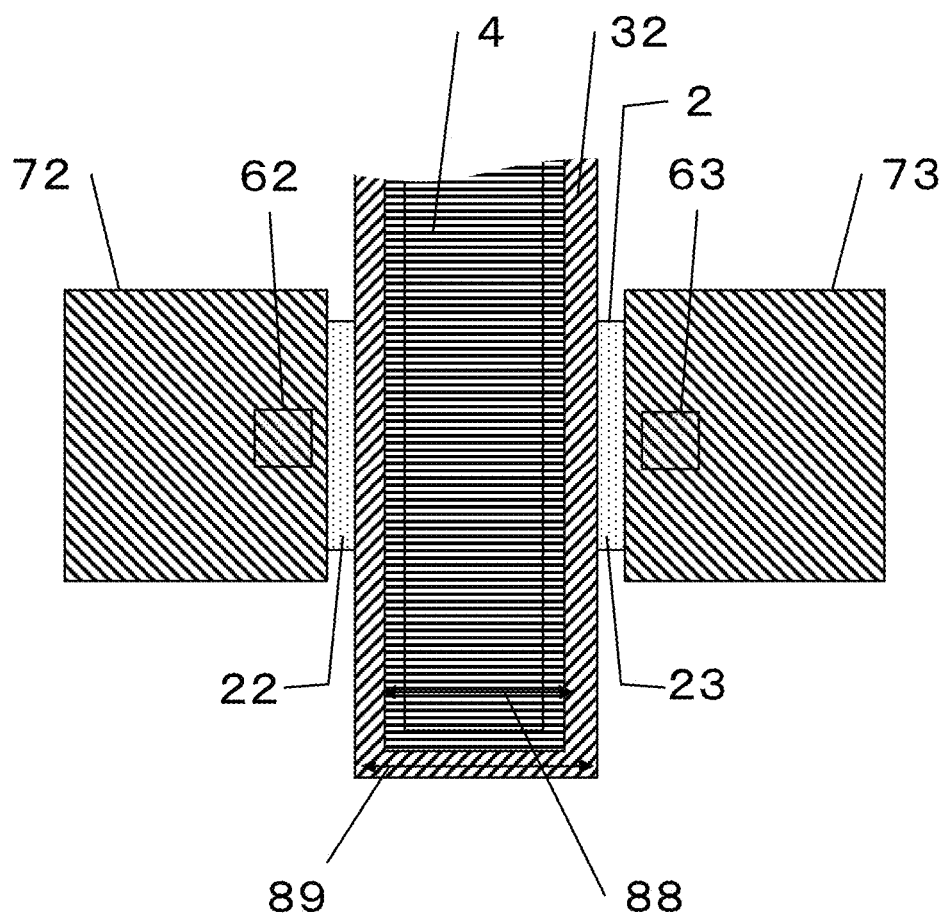
FIG. 34 is a plan view schematically illustrating the top-gate oxide semiconductor TFT according to Modification Example 2 of the invention.

Next, a top-gate oxide semiconductor TFT according to Modification Example 2 of the invention will be described. FIGS. 33 and 34 are a cross-sectional view and a plan view schematically illustrating the top-gate oxide semiconductor TFT according to Modification Example 2 of the invention, respectively. This modification example has the same structure as Embodiment 2 except for a gate electrode and a gate insulating film. The function and effect of this modification example are the same as those of Embodiment 2. Therefore, a difference in the gate electrode and the gate insulating film will be mainly described and the description of the other structures will not be repeated.

As illustrated in FIG. 33, a gate insulating film 3 which is a single-layer film, such as a silicon oxide film, an aluminum oxide film, a hafnium oxide film, a zirconium oxide film, an yttrium oxide film, a lanthanum oxide film, or a tantalum oxide film, or a stacked film thereof and has two shapes is formed over an oxide semiconductor layer 2. A portion of the gate insulating film 3 is removed.

A first gate insulating film 31 located at the lower side in a thickness direction and has a first shape covers the entire oxide semiconductor layer 2. A second gate insulating film 32 located at the upper side in the thickness direction and has a second shape is formed in a forward tapered cross section. In other words, the second gate insulating film 32 is formed such that the length 89 of an interface with the first gate insulating film 31 in the channel length direction is greater than the length 88 of an interface of a gate electrode 4 with the second gate insulating film 32 in the channel length direction. In addition, the length 89 in the channel length direction is greater than the width of a channel region 21 in the channel length direction.

The gate electrode 4 which is a single-layer film made of molybdenum, tantalum, niobium, chromium, tungsten, aluminum, or titanium, a stacked film thereof, or a metal film made of an alloy thereof is formed over the second gate insulating film 32. The gate electrode 4 has a forward tapered cross section. The gate electrode 4 is formed such that the width thereof is less than that of the second gate insulating film 32. That is, the length of the gate electrode 4 in the channel length direction is less than the length 88 of an interface with the second gate insulating film 32 in the channel length direction. In this modification example, the second gate insulating film 32 has a forward tapered cross section and it is difficult to uniformly determine the distance from an end of the gate electrode at the source region side to an end of the second gate insulating film at the source region side and the distance from an end of the gate electrode at the drain region side to an end of the second gate insulating film at the drain region side. Therefore, the distances 84 and 85 are not illustrated in the drawings.

Figure 35:
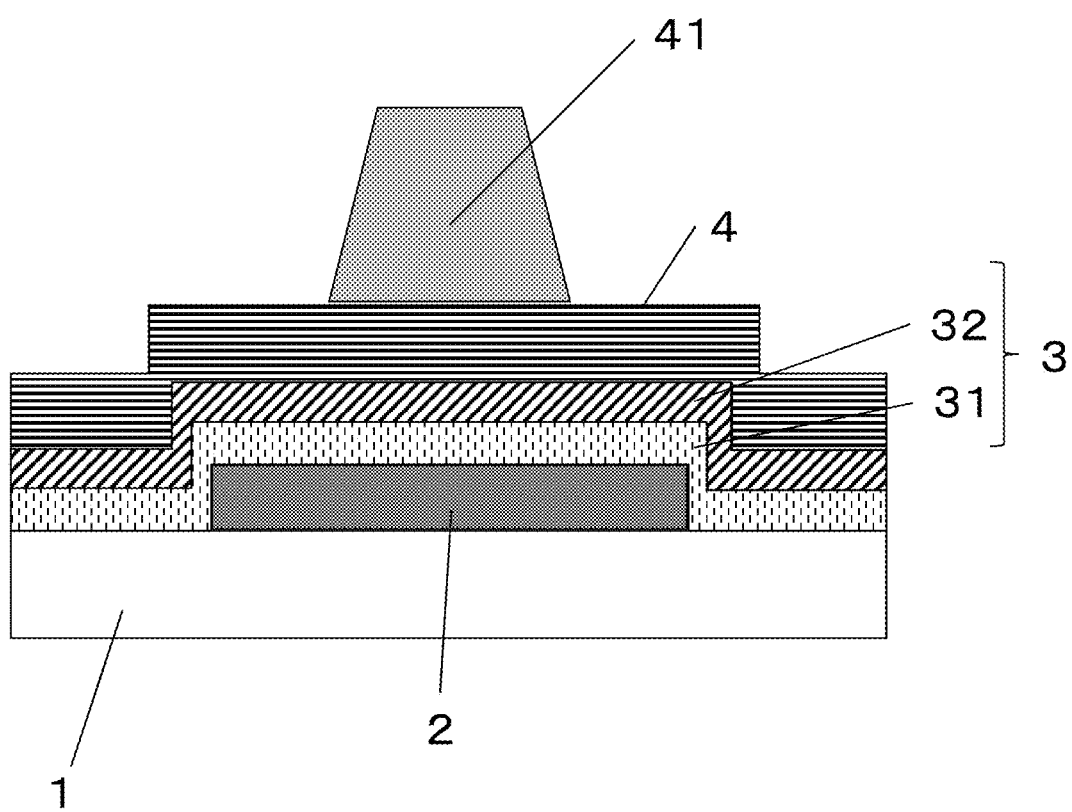
FIG. 35 is a cross-sectional view schematically illustrating each process for manufacturing the top-gate oxide semiconductor TFT according to Modification Example 2 of the invention.
Figure 36:
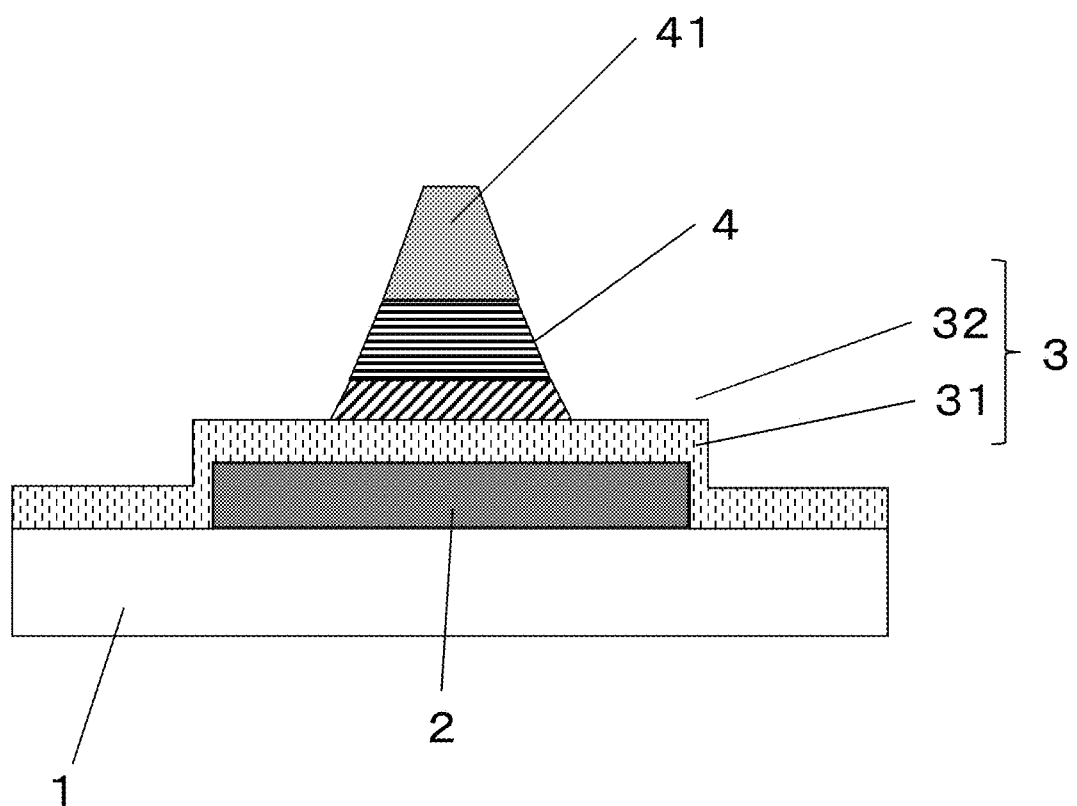
FIG. 36 is a cross-sectional view schematically illustrating each process for manufacturing the top-gate oxide semiconductor TFT according to Modification Example 2 of the invention.
Figure 37:
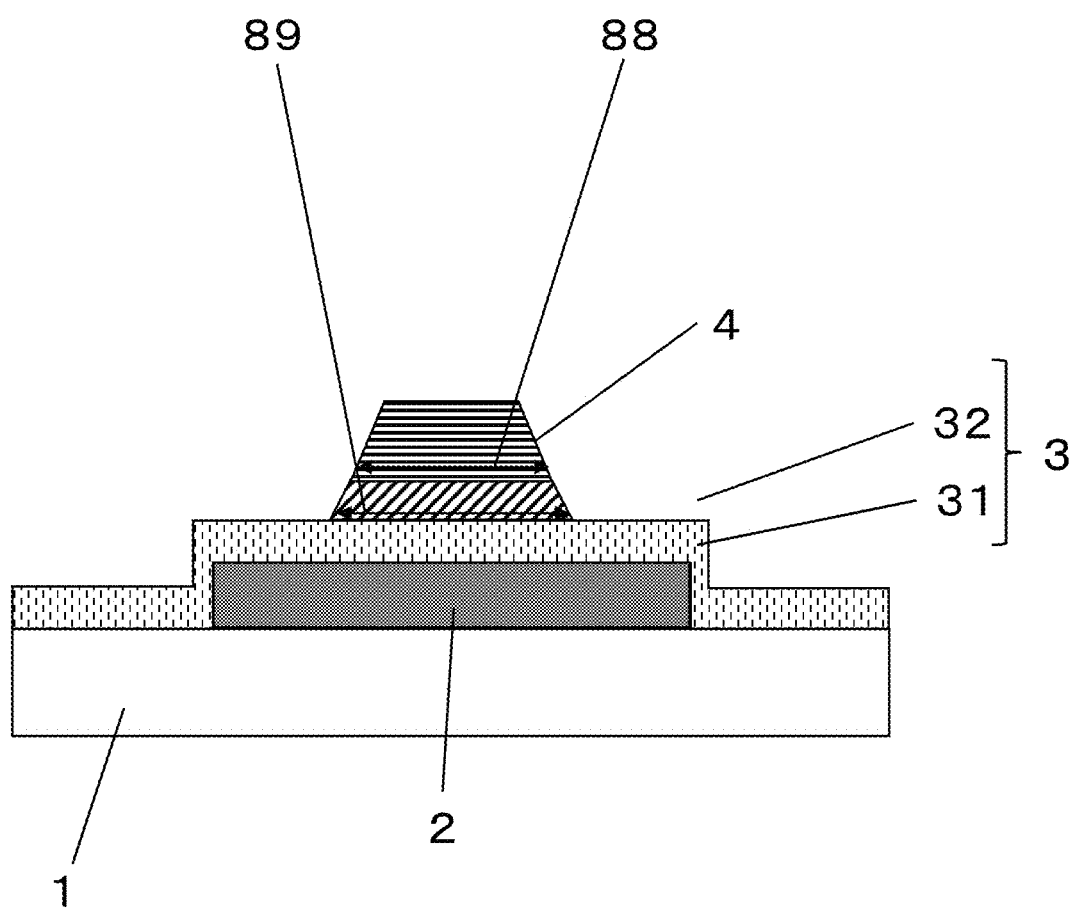
FIG. 37 is a cross-sectional view schematically illustrating each process for manufacturing the top-gate oxide semiconductor TFT according to Modification Example 2 of the invention.

Next, a method for manufacturing the TFT according to Modification Example 2 of the invention will be described. FIGS. 35 to 37 are cross-sectional views schematically illustrating each process for manufacturing the top-gate oxide semiconductor TFT according to Modification Example 2 of the invention. This modification example differs from Embodiment 2 in the cross-sectional structure of the gate electrode and the gate insulating film. Therefore, a difference in the process for manufacturing the gate electrode and the gate insulating film will be mainly described and the description of the other processes will not be repeated.

FIG. 35 will be described. A photolithography process is performed for the same structure as that illustrated in FIG. 13, in which the island-shaped oxide semiconductor layer 2 is formed over the glass substrate 1 and the gate insulating film 3 and the gate electrode 4 are formed over the oxide semiconductor layer 2, to form a resist pattern 41. The resist pattern 41 has a forward tapered cross section, as illustrated in FIG. 35.

As illustrated in FIG. 36, etching is performed along the resist pattern 41 to form the gate electrode 4 and the second gate insulating film 32 in a forward tapered cross section. As the etching, dry etching may be performed while the resist pattern 41 is retreated.

As illustrated in FIG. 37, the resist pattern 41 is removed by a resist removal process. In this way, when the gate insulating film 3 is formed so as to include two layers, that is, the first gate insulating film 31 that is in contact with the oxide semiconductor layer 2 and the second gate insulating film 32 that is in contact with the gate electrode 4, the second gate insulating film 32 is formed in a forward tapered cross section. The second gate insulating film 32 is formed such that the length 89 of an interface with the first gate insulating film 31 in the channel length direction is greater than the length 88 of an interface of the gate electrode 4 with the second gate insulating film 32 in the channel length direction.

After a process of forming an interlayer insulating film, the same processes as those in Embodiment 1 are performed to complete the TFT illustrated in FIGS. 33 and 34.

In this modification example, in the process of forming the interlayer insulating film 5, hydrogen is diffused to the oxide semiconductor layer 2, using the second gate insulating film 32 thicker than the gate electrode 4 as a mask. Therefore, it is possible to improve the reliability of the TFT while reducing parasitic capacitance, similarly to Embodiment 2.

The other structures are the same as those in Embodiment 2. Therefore, it is possible to obtain a top-gate oxide semiconductor TFT with low parasitic capacitance and high reliability.

Figure 38:
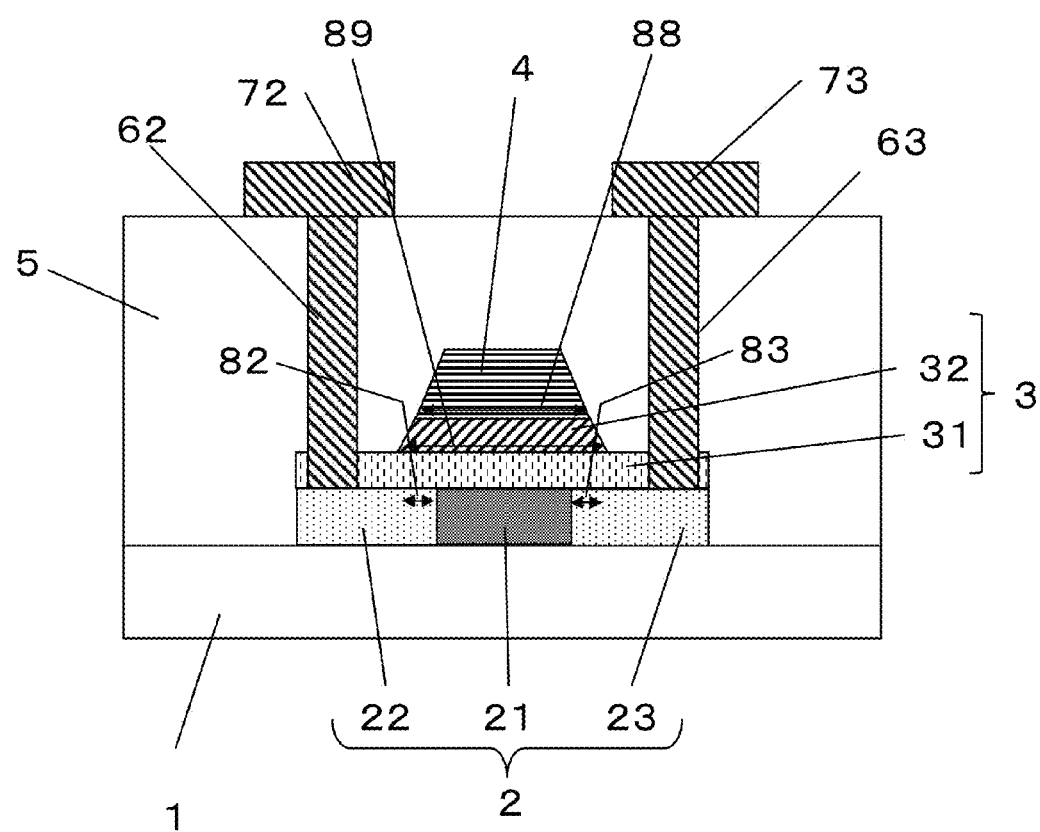
FIG. 38 is a cross-sectional view schematically illustrating a top-gate oxide semiconductor TFT according to Modification Example 3 of the invention.
Figure 39:
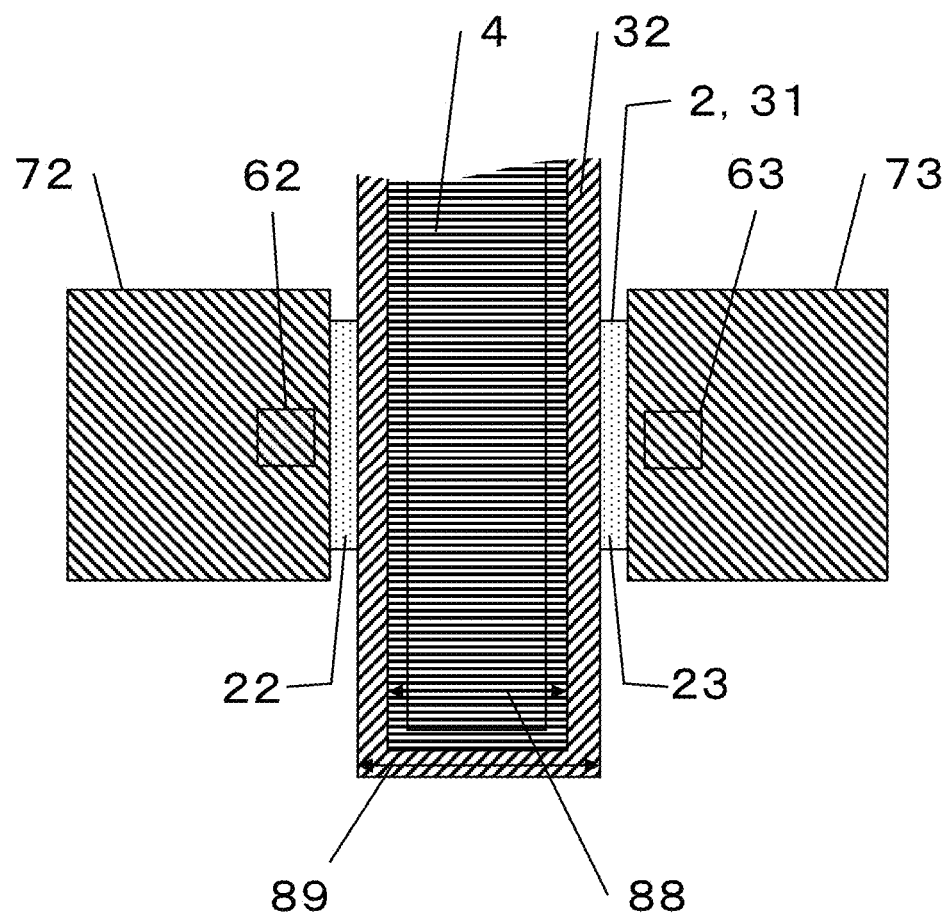
FIG. 39 is a plan view schematically illustrating the top-gate oxide semiconductor TFT according to Modification Example 3 of the invention.

As illustrated in FIGS. 38 and 39, the gate electrode and the second gate insulating film according to Modification Example 2 can be combined with Embodiment 3 to achieve Modification Example 3. The function and effect of Modification Example 3 are the same as those of Embodiment 3.

Embodiment 4

Figure 24:
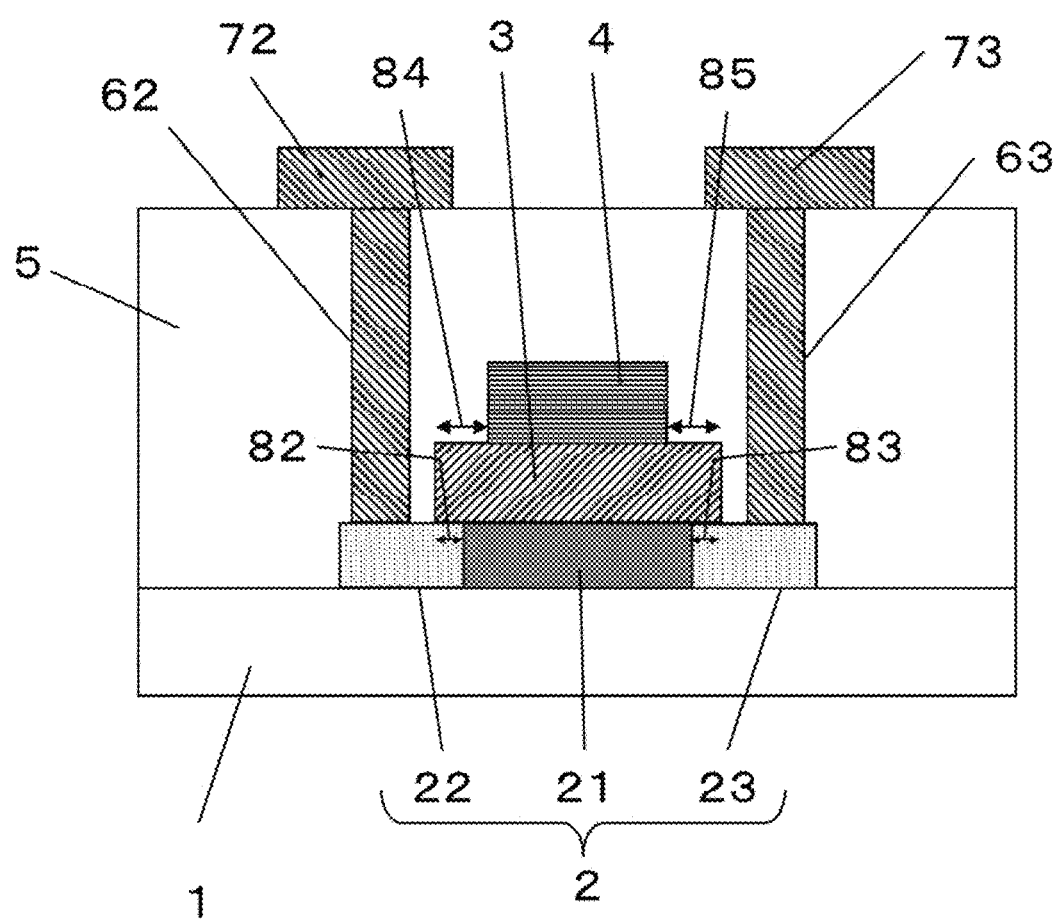
FIG. 24 is a cross-sectional view schematically illustrating a top-gate oxide semiconductor TFT according to Embodiment 4 of the invention.

FIG. 24 is a cross-sectional view schematically illustrating a top-gate oxide semiconductor TFT according to Embodiment 4 of the invention. This embodiment differs from Embodiment 1 in that the boundary between the channel region 21 and the source region 22 and the boundary between the channel region 21 and the drain region 23 are not disposed below the gate electrode 4, but are disposed outside the gate electrode 4.

In the structure according to this embodiment, the gate insulating film 3 is formed such that the length of the gate insulating film 3 in a channel length direction is greater than the sum of the width of the gate electrode 4 in the channel length direction and the diffusion distance of hydrogen by annealing after an interlayer insulating film 5 is formed. For example, in the case illustrated in FIG. 1, the diffusion distance of hydrogen by annealing at 400° C. for 1 hour is 0.5 µm. Therefore, this can be achieved by forming the gate insulating film 3 so as to be thicker by 0.5 µm or more than the gate electrode 4 at one side.

Since the TFT according to this embodiment is an offset TFT, it is possible to increase a breakdown voltage between a source electrode 72 and a drain electrode 73. Therefore, the TFT can be applied to a structure in which emphasis is particularly placed on the breakdown voltage.

When the interlayer insulating film 5 is formed, hydrogen is diffused to the oxide semiconductor layer 2, using the gate insulating film 3, of which the length in the channel length direction is greater than the width of the gate electrode 4 in the channel length direction, as a mask. Therefore, the boundary between the channel region 21 and the source region 22 and the boundary between the channel region 21 and the drain region 23 are formed at the positions that are separated from the gate electrode 4. As a result, it is possible to ensure the diffusion distance of hydrogen. It is possible to form the interlayer insulating film 5 at a high temperature of 300° C. or higher. Therefore, it is possible to obtain the interlayer insulating film 5 with good electrical characteristics and high density. As a result, it is possible to improve the reliability of the TFT.

In this embodiment, an example of the structure of the gate insulating film 3 having a single shape has been described, similarly to Embodiment 1. The structure according to this embodiment can also be applied to the case in which the gate insulating film 3 having two different shapes is used as in Embodiment 2 and Embodiment 3. That is, the structure according to this embodiment can be applied to the gate insulating film 3 which is patterned in one or more shapes in a plan view in a direction normal to the surface of a substrate and in which a minimum gate insulating film with the smallest size is provided such that the length thereof in the channel length direction is greater than the width of the gate electrode 4 in the channel length direction. The gate insulating film 3 according to this embodiment is a patterned gate insulating film.

In Embodiments 1 to 4, an example in which the oxide semiconductor layer 2 has a simple rectangular shape as viewed from the direction normal to the surface of the substrate 1 has been described. However, the oxide semiconductor layer 2 may have shapes, such as a ring shape and a U-shape, other than the simple rectangular shape. In this case, a TFT, of which the cross-sectional structure includes the cross-sectional structures described in Embodiments 1 to 4, is included in the technical scope of the invention.

Embodiment 5

Figure 25:
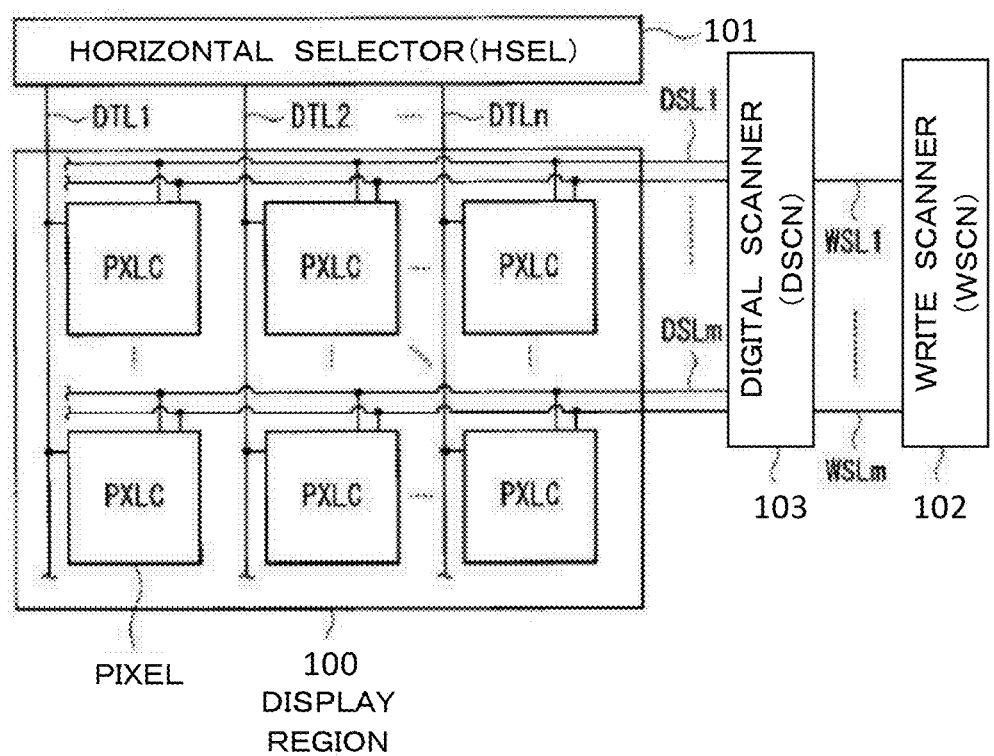
FIG. 25 is a diagram illustrating the overall structure of a display device used as an OLED display which includes a peripheral circuit.

This embodiment relates to a display device that uses the TFT described in Embodiments 1 to 4. FIG. 25 is a diagram illustrating the overall structure of the display device used as an OLED display which includes a peripheral circuit. An example of the overall structure of the display device according to this embodiment and an example of the structure of a pixel circuit 110 (see FIG. 26) will be described with reference to FIG. 25. A display region 100 in which a plurality of pixels PXLC, each of which includes an organic EL element 114 (see FIG. 26), are arranged in a matrix is formed at an insulating substrate 1. A horizontal selector (HSEL) 101 serving as a signal line driving circuit, a write scanner (WSCN) 102 serving as a scanning line driving circuit, and a digital scanner (DSCN) 103 serving as a power line driving circuit are provided at the periphery of the display region 100. HSEL is an abbreviation of Horizontal Selector and means a horizontal selector. WSCN is an abbreviation of Write Scanner and means a write scanner. DSCN is an abbreviation of Digital Scanner and means a digital scanner.

In the display region 100, n signal lines DTL1 to DTLn (n is an integer that is equal to or greater than 2) are arranged in a column direction. In the following description, when it is not necessary to specify the number of the signal line, the signal line is referred to as a signal line DTL. In addition, m scanning lines WSL1 to WSLm (m is an integer that is equal to or greater than 2) and m power lines DSL1 to DSLm are arranged in a row direction. In the following description, when it is not necessary to specify the numbers of the scanning line and the power line, the scanning line and the power line are referred to as a scanning line WSL and a power line DSL, respectively. The pixel PXLC is provided at an intersection point between each signal line DTL and each scanning line WSL. The pixel PXLC corresponds to any one of R, G, and B. The horizontal selector 101 is connected to each signal line DTL. The horizontal selector 101 supplies a video signal to each signal line DTL. Each scanning line WSL is connected to the write scanner 102. The write scanner 102 supplies a selection pulse, which is a scanning signal, to each scanning line WSL. Each power line DSL is connected to the digital scanner 103 and the digital scanner 103 supplies a control pulse, which is a power signal, to each power line DSL.

Figure 26:
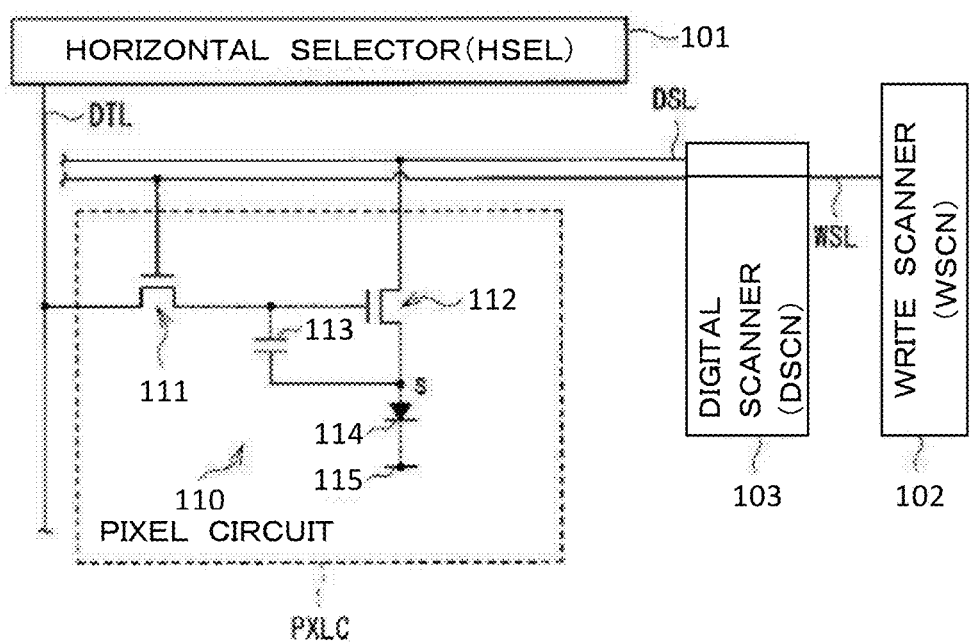
FIG. 26 is a diagram illustrating an example of the specific circuit structure of a pixel PXLC.
Figure 27:
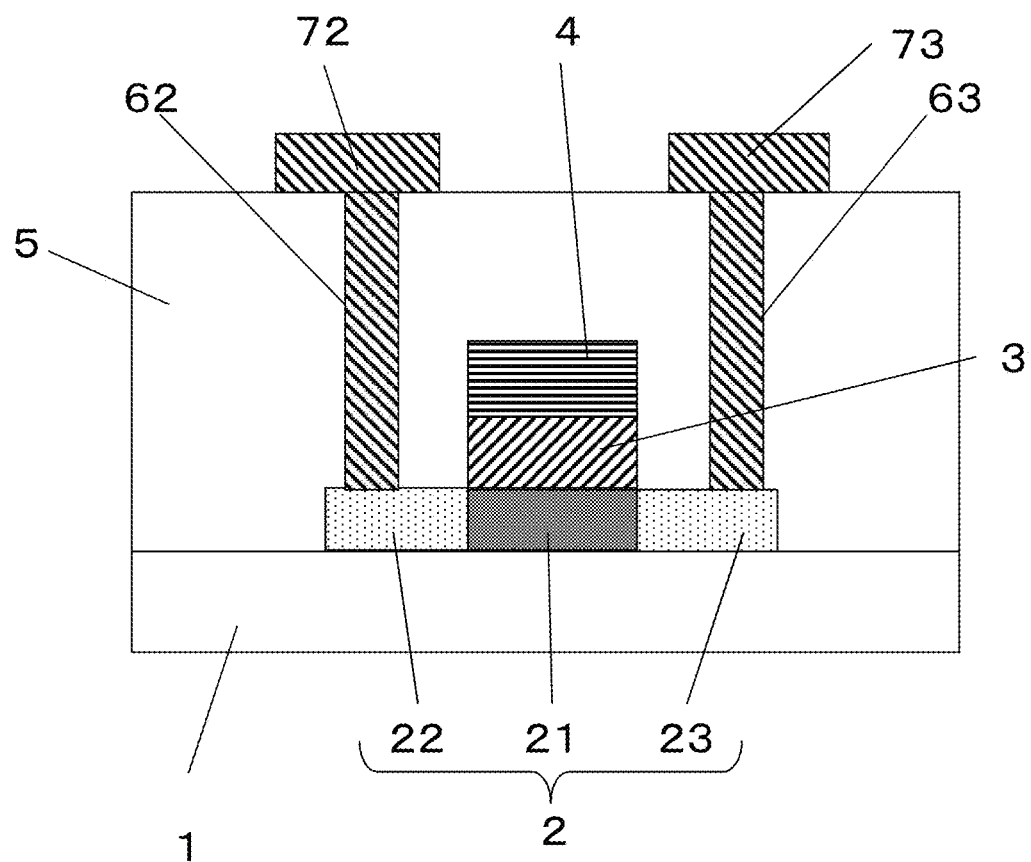
FIG. 27 is a cross-sectional view schematically illustrating a self-aligned top-gate TFT disclosed in Japanese Patent Application Laid-Open No. 2007-220817.

FIG. 26 is a diagram illustrating an example of the specific circuit configuration of the pixel PXLC. Each pixel PXLC includes the pixel circuit 110 including the organic EL element 114. The pixel circuit 110 is an active driving circuit including a sampling transistor 111, a driving transistor 112, a capacitive element 113, and the organic EL element 114. The TFT described in any one of Embodiments 1 to 4 is used as the sampling transistor 111 or/and the driving transistor 112.

A gate of the sampling transistor 111 is connected to the corresponding scanning line WSL. One of the source and drain of the sampling transistor 111 is connected to the corresponding signal line DTL and the other is connected to a gate of the driving transistor 112. A drain of the driving transistor 112 is connected to the corresponding power line DSL. A source of the driving transistor 112 is connected to an anode of the organic EL element 114. A cathode of the organic EL element 114 is connected to a ground line 115. The ground line 115 is common to all of the pixels PXLC.

The capacitive element 113 is provided between the source and gate of the driving transistor 112.

The sampling transistor 111 is turned on according to the selection pulse which is the scanning signal supplied from the scanning line WSL, samples the potential of the video signal supplied from the signal line DTL, and stores the potential in the capacitive element 113. The driving transistor 112 is supplied with a current from the power line DSL which is set to a predetermined first potential (not illustrated) and supplies a driving current to the organic EL element 114 according to the signal potential stored in the capacitive element 113. The organic EL element 114 emits light with brightness corresponding to the potential of the video signal, in response to the driving current supplied from the driving transistor 112.

In this circuit structure, the sampling transistor 111 is turned on according to the selection pulse which is the scanning signal supplied from the scanning line WSL, samples the potential of the video signal supplied from the signal line DTL, and stores the potential in the capacitive element 113. A current is supplied from the power line DSL which is set to the first potential to the driving transistor 112 and a driving current is supplied to the organic EL element 114 according to the signal potential stored in the capacitive element 113. The organic EL element 114 emits red, green, or blue light. The organic EL element 114 emits light with brightness corresponding to the potential of the video signal in response to the supplied driving current. In this way, the display device displays a video based on the video signal.

In addition, technical characteristics (configuration requirements) described in each embodiment may be combined with each other, and new technical characteristics may be formed by combining the same.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A thin film transistor comprising:
    an insulating substrate;
    an oxide semiconductor layer that is provided over the substrate and includes a channel region, a source region and a drain region, the source and drain regions having a lower resistance than the channel region;
    a gate insulating film that is provided over the oxide semiconductor layer;
    a gate electrode that is provided over the gate insulating film;
    an interlayer insulating film that is provided over the gate electrode, the gate insulating film and the oxide semiconductor layer, and contains hydrogen; a source electrode that is electrically connected to the source region through a contact hole which is formed in the interlayer insulating film; and a drain electrode that is electrically connected to the drain region through a contact hole which is formed in the interlayer insulating film;
    wherein the gate insulating film includes one layer or two layers, at least one of the layers of the gate insulating film is a patterned gate insulating film located at a position separated from the source electrode and the drain electrode, a length of a lower surface of the patterned gate insulating film in a channel length direction is greater than a length of a lower surface of the gate electrode in the channel length direction, the length of the lower surface of the patterned gate insulating film in the channel length direction is greater than a length of the channel region in the channel length direction, and the source region and the drain region have a higher hydrogen concentration than the channel region,
    in the oxide semiconductor layer, a distance from a source-region-side end of the patterned gate insulating film to a boundary between the source region and the channel region is equal to a distance from a drain-region-side end of the patterned gate insulating film to a boundary between the drain region and the channel region, and
    any one of the layers of the gate insulating film at least partially includes at least one of an aluminum oxide film, a hafnium oxide film, a zirconium oxide film, an yttrium oxide film, a lanthanum oxide film, and a tantalum oxide film.

2. The thin film transistor according to claim 1, wherein the gate insulating film has a forward tapered cross section, and the length of the gate insulating film in the channel length direction at an interface with the oxide semiconductor layer is greater than the length of the gate electrode in the channel length direction at an interface with the gate insulating film.

3. The thin film transistor according to claim 1, wherein the boundary between the channel region and the source region and the boundary between the channel region and the drain region are located below the gate electrode.

4. The thin film transistor according to claim 1, wherein the gate insulating film or the patterned gate insulating film has a thickness of 50 nm or more.

5. The thin film transistor according to claim 1, wherein the gate insulating film is a silicon oxide film.

6. The thin film transistor according to claim 1, wherein a difference between the hydrogen concentration of the channel region and the hydrogen concentration of the source region or the drain region is equal to or greater than $2 \times 10^{20}$ cm$^{-3}$.

7. A thin film transistor comprising:
    an insulating substrate;
    an oxide semiconductor layer that is provided over the substrate and includes a channel region, a source region and a drain region, the source and drain regions having a lower resistance than the channel region;
    a gate insulating film that is provided over the oxide semiconductor layer;
    a gate electrode that is provided over the gate insulating film;
    an interlayer insulating film that is provided over the gate electrode, the gate insulating film and the oxide semiconductor layer, and contains hydrogen;
    a source electrode that is electrically connected to the source region through a contact hole which is formed in the interlayer insulating film; and
    a drain electrode that is electrically connected to the drain region through a contact hole which is formed in the interlayer insulating film;
    wherein
    the gate insulating film includes one layer or two layers, at least one of the layers of the gate insulating film is a patterned gate insulating film located at a position separated from the source electrode and the drain electrode, a length of a lower surface of the patterned gate insulating film in a channel length direction is greater than a length of a lower surface of the gate electrode in the channel length direction, the length of the lower surface of the patterned gate insulating film in the channel length direction is greater than a length of the channel region in the channel length direction, the source region and the drain region have a higher hydrogen concentration than the channel region, in the oxide semiconductor layer, a distance from a source-region-side end of the patterned gate insulating film to a boundary between the source region and the channel region is equal to a distance from a drain-region-side end of the patterned gate insulating film to a boundary between the drain region and the channel region, and a distance from a source-region-side end of the gate electrode to a source-region-side end of a minimum gate insulating film, which has the smallest size among the gate insulating films, is equal to a drain-region-side end of the gate electrode to a drain-region-side end of the minimum gate insulating film.

8. A method for manufacturing a thin film transistor comprising:

a step of forming an oxide semiconductor layer having an island-shaped pattern over an insulating substrate;

a step of forming a gate insulating film over the substrate and the oxide semiconductor layer;

a step of forming a gate electrode over the gate insulating film;

a step of forming an interlayer insulating film over the gate electrode in an atmosphere including hydrogen;

a step of forming contact holes in the interlayer insulating film;

a step of forming a source electrode and a drain electrode over the interlayer insulating film through the contact holes; and a step of annealing after the interlayer insulating film is formed, wherein in the step of forming the gate insulating film, the gate insulating film is formed in one or more shapes in a plan view in a direction normal to a surface of the substrate, a length of a minimum gate insulating film, which has the smallest size among the gate insulating films, in a channel length direction is greater than a width of the gate electrode in the channel length direction, in the step of forming the gate insulating film, the gate insulating film is formed in one or more shapes in a plan view in a direction normal to a surface of the substrate, a length of a minimum gate insulating film, which has the smallest size among the gate insulating films, in a channel length direction is greater than a width of the gate electrode in the channel length direction, in the step of forming the interlayer insulating film, the hydrogen is diffused to a portion of the oxide semiconductor layer which is not covered with the minimum gate insulating film to form a source region and a drain region, and the diffusion of the hydrogen to a portion of the oxide semiconductor layer which is covered with the minimum gate insulating film is suppressed to form a channel region, in the step of annealing, hydrogen is diffused from the source region and the drain region in a horizontal direction to move a boundary between the channel region and the source region and a boundary between the channel region and the drain region to be located below the minimum gate insulating film, the gate insulating film is formed so as to include two layers of a first gate insulating film that is in contact with the oxide semiconductor layer and a second gate insulating film that is in contact with the gate electrode, in a step of forming the second gate insulating film, a length of the second gate insulating film in the channel length direction is greater than the width of the gate electrode in the channel length direction, in the step of forming the interlayer insulating film, the hydrogen is diffused to a portion of the oxide semiconductor layer which is not covered with the second gate insulating film to form the source region and the drain region, and the diffusion of the hydrogen to a portion of the oxide semiconductor layer which is covered with the second gate insulating film is suppressed to form the channel region, and in the step of annealing, hydrogen is diffused from the source region and the drain region in the horizontal direction to move the boundary between the channel region and the source region and the boundary between the channel region and the drain region to be located below the second gate insulating film.

9. A method for manufacturing a thin film transistor comprising:

a step of forming an oxide semiconductor layer having an island-shaped pattern over an insulating substrate;

a step of forming a gate insulating film over the substrate and the oxide semiconductor layer;

a step of forming a gate electrode over the gate insulating film;

a step of forming an interlayer insulating film over the gate electrode in an atmosphere including hydrogen;

a step of forming contact holes in the interlayer insulating film;

a step of forming a source electrode and a drain electrode over the interlayer insulating film through the contact holes; and a step of annealing after the interlayer insulating film is formed, wherein in the step of forming the gate insulating film, the gate insulating film is formed in one or more shapes in a plan view in a direction normal to a surface of the substrate, a length of a minimum gate insulating film, which has the smallest size among the gate insulating films, in a channel length direction is greater than a width of the gate electrode in the channel length direction, in the step of forming the interlayer insulating film, the hydrogen is diffused to a portion of the oxide semiconductor layer which is not covered with the minimum gate insulating film to form a source region and a drain region, and the diffusion of the hydrogen to a portion of the oxide semiconductor layer which is covered with the minimum gate insulating film is suppressed to form a channel region, in the step of annealing, hydrogen is diffused from the source region and the drain region in a horizontal direction to move a boundary between the channel region and the source region and a boundary between the channel region and the drain region to be located below the minimum gate insulating film, the gate insulating film is formed so as to include two layers of a first gate insulating film that is in contact with the oxide semiconductor layer and a second gate insulating film that is in contact with the gate electrode, the first gate insulating film is formed in an island-shaped pattern having the same shape as the oxide semiconductor layer, in a step of forming the second gate insulating film, a length of the second gate insulating film in the channel length direction is greater than the width of the gate electrode in the channel length direction, in the step of forming the interlayer insulating film, the hydrogen is diffused to a portion of the oxide semiconductor layer which is not covered with the second gate insulating film to form the source region and the drain region, and the diffusion of the hydrogen to a portion of the oxide semiconductor layer which is covered with the second gate insulating film is suppressed to form the channel region, and in the step of annealing, hydrogen is diffused from the source region and the drain region in the horizontal direction to move the boundary between the channel region and the source region and the boundary between the channel region and the drain region to be located below the second gate insulating film.

10. The method for manufacturing a thin film transistor according to claim 8, wherein, in the step of forming the second gate insulating film, the second gate insulating film is formed so as to have a forward tapered cross section and the length of the second gate insulating film in the channel length direction at an interface with the first gate insulating film is greater than the length of the gate electrode in the channel length direction at an interface with the second gate insulating film.

11. A method for manufacturing a thin film transistor comprising:
   a step of forming an oxide semiconductor layer having an island-shaped pattern over an insulating substrate;
   a step of forming a gate insulating film over the substrate and the oxide semiconductor layer;
   a step of forming a gate electrode over the gate insulating film;
   a step of forming an interlayer insulating film over the gate electrode in an atmosphere including hydrogen;
   a step of forming contact holes in the interlayer insulating film;
   a step of forming a source electrode and a drain electrode over the interlayer insulating film through the contact holes; and
   a step of annealing after the interlayer insulating film is formed,
   wherein
   in the step of forming the gate insulating film, the gate insulating film is formed in one or more shapes in a plan view in a direction normal to a surface of the substrate,
   a length of a minimum gate insulating film, which has the smallest size among the gate insulating films, in a channel length direction is greater than a width of the gate electrode in the channel length direction,
   in the step of forming the interlayer insulating film, the hydrogen is diffused to a portion of the oxide semiconductor layer which is not covered with the minimum gate insulating film to form a source region and a drain region, and the diffusion of the hydrogen to a portion of the oxide semiconductor layer which is covered with the minimum gate insulating film is suppressed to form a channel region,
   in the step of annealing after the interlayer insulating film is formed, hydrogen is diffused from the source region and the drain region in a horizontal direction to move a boundary between the channel region and the source region and a boundary between the channel region and the drain region to be located below the minimum gate insulating film, and
   in the step of annealing after the interlayer insulating film is formed, hydrogen is diffused from the source region and the drain region in the horizontal direction to leave the boundary between the channel region and the source region and the boundary between the channel region and the drain region outside the gate electrode.

12. A method for manufacturing a thin film transistor comprising:
   a step of forming an oxide semiconductor layer having an island-shaped pattern over an insulating substrate;
   a step of forming a gate insulating film over the substrate and the oxide semiconductor layer;
   a step of forming a gate electrode over the gate insulating film;
   a step of forming an interlayer insulating film over the gate electrode in an atmosphere including hydrogen;
   a step of forming contact holes in the interlayer insulating film;
   a step of forming a source electrode and a drain electrode over the interlayer insulating film through the contact holes; and
   a step of annealing after the interlayer insulating film is formed,
   wherein
   in the step of forming the gate insulating film, the gate insulating film is formed in one or more shapes in a plan view in a direction normal to a surface of the substrate,
   a length of a minimum gate insulating film, which has the smallest size among the gate insulating films, in a channel length direction is greater than a width of the gate electrode in the channel length direction,
   in the step of forming the interlayer insulating film, the hydrogen is diffused to a portion of the oxide semiconductor layer which is not covered with the minimum gate insulating film to form a source region and a drain region, and the diffusion of the hydrogen to a portion of the oxide semiconductor layer which is covered with the minimum gate insulating film is suppressed to form a channel region,
   in the step of annealing, hydrogen is diffused from the source region and the drain region in a horizontal direction to move a boundary between the channel region and the source region and a boundary between the channel region and the drain region to be located below the minimum gate insulating film, and
   in the step of forming the gate electrode, etching is performed while a pattern forming at least a portion of the pattern of the gate insulating film is retreated.

* * * * *